(12) United States Patent
Inaba et al.

(10) Patent No.: US 12,707,917 B2
(45) Date of Patent: Aug. 11, 2026

(54) SUBSTRATE PROCESSING METHOD AND SUBSTRATE PROCESSING DEVICE

(71) Applicant: SCREEN Holdings Co., Ltd., Kyoto (JP)

(72) Inventors: Masaki Inaba, Kyoto (JP); Eiji Umeda, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 335 days.

(21) Appl. No.: 18/690,718

(22) PCT Filed: Jun. 20, 2022

(86) PCT No.: PCT/JP2022/024512
§ 371 (c)(1),
(2) Date: Oct. 22, 2024

(87) PCT Pub. No.: WO2023/047723
PCT Pub. Date: Mar. 30, 2023

(65) Prior Publication Data

US 2025/0201593 A1 Jun. 19, 2025

(30) Foreign Application Priority Data

Sep. 24, 2021 (JP) ................................ 2021-155043

(51) Int. Cl.
*H01L 21/67* (2006.01)
*H01L 21/306* (2006.01)
(Continued)

(52) U.S. Cl.
CPC ........ *H10P 72/0424* (2026.01); *H10P 50/642* (2026.01); *H10P 72/0408* (2026.01);
(Continued)

(58) Field of Classification Search
CPC .. H10P 72/0414; H10P 72/0424; H10P 50/00; H10P 50/642; H10P 52/00;
(Continued)

(56) References Cited

U.S. PATENT DOCUMENTS 6,924,236 B2 * 8/2005 Yano ...................... H10P 70/54 438/692
2001/0037858 A1 11/2001 Taniyama et al.
(Continued)

FOREIGN PATENT DOCUMENTS

JP 2001-319910 A 11/2001
JP 2003203900 A * 7/2003
(Continued)

OTHER PUBLICATIONS

International Preliminary Report on Patentability (Chapter 1) with a Notification from the International Bureau (Form PCT/IB/326) mailed Apr. 4, 2024 in corresponding International Application No. PCT/JP2022/024512.
(Continued)

*Primary Examiner* — Benjamin L Osterhout
(74) *Attorney, Agent, or Firm* — OSTROLENK FABER LLP

(57) ABSTRACT

A substrate processing method processes a substrate having a first principal surface that has a first peripheral edge portion, a second principal surface that has a second peripheral edge portion, and an outer peripheral end that couples the first peripheral edge portion and the second peripheral edge portion. The method includes a protection film forming step of supplying a protection film formation liquid to the first principal surface and forming a protection film in the first peripheral edge portion, a first chemical liquid supplying step of supplying a chemical liquid to the second principal surface, allowing the chemical liquid to reach the
(Continued)

outer peripheral end, and processing the outer peripheral end with the chemical liquid in a state where the protection film is formed in the first peripheral edge portion, and a protection film removing step of removing the protection film after the first chemical liquid supplying step.

12 Claims, 15 Drawing Sheets

(51) Int. Cl.

| | |
|---|---|
| ***H01L 21/687*** | (2006.01) |
| ***H10P 50/64*** | (2026.01) |
| ***H10P 72/00*** | (2026.01) |
| ***H10P 72/76*** | (2026.01) |
| *H10P 50/00* | (2026.01) |
| *H10P 52/00* | (2026.01) |
| *H10P 76/00* | (2026.01) |

(52) U.S. Cl.
CPC ...... *H10P 72/0414* (2026.01); *H10P 72/7618* (2026.01); *H10P 50/00* (2026.01); *H10P 52/00* (2026.01); *H10P 72/0406* (2026.01); *H10P 76/00* (2026.01)

(58) Field of Classification Search
CPC ............. H10P 72/0406; H10P 72/0408; H10P 72/7618; H10P 76/00
See application file for complete search history.

(56) References Cited

U.S. PATENT DOCUMENTS

| | | | | |
|---|---|---|---|---|
| 2011/0240067 | A1 | 10/2011 | Kishimoto et al. | |
| 2014/0038423 | A1 | 2/2014 | Iwao et al. | |
| 2014/0065295 | A1 | 3/2014 | Emoto et al. | 427/8 |
| 2014/0206202 | A1* | 7/2014 | Kimura | H10P 70/20<br>438/761 |
| 2018/0012754 | A1 | 1/2018 | Nanba | |
| 2018/0088466 | A1 | 3/2018 | Kawakami et al. | |

FOREIGN PATENT DOCUMENTS

| | | | | | |
|---|---|---|---|---|---|
| JP | 2005-064325 | A | | 3/2005 | |
| JP | 2006-073577 | A | | 3/2006 | |
| JP | 2015-000356 | A | | 1/2015 | |
| JP | 2016-139743 | A | | 8/2016 | |
| JP | 2017-098333 | A1 | | 6/2017 | |
| JP | 2017-191849 | A | | 10/2017 | |
| JP | 2018049911 | A | * | 3/2018 | G03F 7/11 |
| JP | 2018049987 | A | * | 3/2018 | H10P 76/2041 |
| JP | 2018-101816 | A | | 6/2018 | |
| JP | 2019024129 | A | * | 2/2019 | |
| JP | 2019047131 | A | * | 3/2019 | |
| JP | 2019-220514 | A | | 12/2019 | |
| JP | 2020-013911 | A | | 1/2020 | |
| KR | 10-2018-0033103 | A | | 4/2018 | |
| WO | WO-2006028173 | A1 | * | 3/2006 | H10P 72/0474 |
| WO | WO-2020050041 | A1 | * | 3/2020 | H10P 72/30 |

OTHER PUBLICATIONS

English translation of the International Preliminary Report on Patentability (Chapter 1) with a Notification from the International Bureau (Form PCT/IB/338) mailed Apr. 4, 2024 in corresponding International Application No. PCT/JP2022/024512.

International Search Report mailed Aug. 30, 2022 in corresponding PCT International Application No. PCT/JP2022/024512.

Written Opinion mailed Aug. 18, 2022 in corresponding PCT International Application No. PCT/JP2022/024512.

* cited by examiner 1
4
TW
6
2W(2)
CR
TR
IR
Controller
3
LP
W
C 1
(2)2W
Removing liquid
Protection film formation liquid
Rinsing liquid
Etching liquid
41
51
28
9
15
40
50
27
8
15
33
31
32
54
53
44
43
42
16
10
W1
20a
20
A1
22
CP
23a
23
21
W
W2
E
5
26
24
25
6

1, 1A
3
Controller
3A
CPU
Memory
3B
I R, CR
Transfer robot
22
Rotary driving mechanism
Spin base
20
27, 28, 29, 30
Nozzle driving mechanism
Nozzle
8, 9, 11, 12
Valve
26, 50, 51, 53, 54, 55, 56
76
Pin driving mechanism
Lift pin
75
74
Energizing unit
Light emitting member
73

Start
S1
Carry-in step
S2
Protection film forming step
S3
Etching step
S4
Rinsing step
S5
Protection film removing step
S6
Spin drying step
S7
Carry-out step
End 1
(2) 2W
Rinsing liquid
Removing liquid
Protection film formation liquid
Etching liquid
Rinsing liquid
Etching liquid
46
56
12
15
30
41
51
28
9
15
40
50
27
8
15
45
55
11
15
29
33
31
32
W1
16
10
20a
20
CP
23a
A1
21
22
23
5
W
W2
E
6
54
53
44
43
42
26
24
25

Etching liquid
11
15
CP
114
W1
100
110
L1
113
W
E
112
111
W2
16
10
A1
Etching liquid Rinsing liquid
12
15
CP
114
W1
100
110
113
W
E
112
111
W2
16
10
A1
Rinsing liquid 1A
4
TW
71
2D(2)
4
TW
6
2W(2)
TR
CR
IR
Controller
3
LP
W
C Start
S10
First carry-in step
S11
Protection film forming step
S12
Etching step
S13
Rinsing step
S14
Spin drying step
S15
First carry-out step
S16
Second carry-in step
S17
Protection film removing step
S18
Second carry-out step
End CP
114
W1
105a
102
110
105
113
W
112
E
111
W2
16
11
A1
Rinsing liquid

SUBSTRATE PROCESSING METHOD AND SUBSTRATE PROCESSING DEVICE

CROSS-REFERENCE TO RELATED APPLICATIONS

The present application is a 35 U.S.C. §§ 371 national stage application of International Application No. PCT/JP2022/024512 filed Jun. 20, 2022, which claims priority to Japanese Patent Application No. 2021-155043, filed Sep. 24, 2021, the contents of which are incorporated herein by reference.

RELATED APPLICATION

The present application claims the benefit of priority based on Japanese Patent Application No. 2021-155043 filed on Sep. 24, 2021 with the Japan Patent Office, and the entire disclosure of which incorporated herein by reference.

TECHNICAL FIELD

The present invention relates to a substrate processing method that processes a substrate and a substrate processing apparatus that processes a substrate. The substrate to be processed includes, for example, a semiconductor wafer, a substrate for a flat panel display (FPD) such as a liquid crystal display and an organic electroluminescence (EL) display, a substrate for an optical disc, a substrate for a magnetic disk, a substrate for a magneto-optical disc, a substrate for a photomask, a ceramic substrate, and a substrate for a solar cell.

BACKGROUND ART

Patent Literature 1 below discloses substrate processing of supplying an etching inhibitor liquid to a surface where a device is not formed when an etching liquid is supplied to a surface of a substrate where a device is formed. In the substrate processing, by diluting the etching liquid by the etching inhibitor liquid, it is possible to lower an etching rate.

CITATION LIST

Patent Literature

Patent Literature 1: Japanese Patent Application Publication No. 2016-139743

SUMMARY OF INVENTION

Technical Problem

In the substrate processing disclosed in Patent Literature 1, a boundary of collision between the etching inhibitor liquid and the etching liquid is not clear. Therefore, it is difficult to define a region to be processed with the etching liquid at an end edge of the substrate and the vicinity thereof.

Thus, an object of the present invention is to provide a substrate processing method and a substrate processing apparatus capable of precisely processing an outer peripheral end of a substrate with a chemical liquid.

Solution to Problem

A preferred embodiment of the present invention provides a substrate processing method that processes a substrate having a first principal surface that has a first peripheral edge portion, a second principal surface that is a surface on the opposite side of the first principal surface, the second principal surface having a second peripheral edge portion, and an outer peripheral end that couples the first peripheral edge portion and the second peripheral edge portion.

The substrate processing method includes a protection film forming step of supplying a protection film formation liquid to the first principal surface, and forming a protection film in the first peripheral edge portion, a first chemical liquid supplying step of supplying a chemical liquid to the second principal surface, allowing the chemical liquid to reach the outer peripheral end, and processing the outer peripheral end with the chemical liquid in a state where the protection film is formed in the first peripheral edge portion, and a protection film removing step of removing the protection film after the first chemical liquid supplying step.

According to the present method, after the protection film formation liquid is supplied to the first principal surface and the protection film is formed in the first peripheral edge portion of the first principal surface, the chemical liquid is supplied to the second principal surface in a state where the protection film is formed in the first peripheral edge portion. By supplying the chemical liquid to the second principal surface, the chemical liquid reaches the outer peripheral end that couples the first peripheral edge portion of the first principal surface and the second peripheral edge portion of the second principal surface. The outer peripheral end is processed with the chemical liquid.

When the outer peripheral end is processed with the chemical liquid, the first peripheral edge portion of the first principal surface is protected by the protection film. Therefore, even when the chemical liquid on the second principal surface runs down the second peripheral edge portion and the outer peripheral end and reaches the first peripheral edge portion, it is possible to suppress the first peripheral edge portion from being processed with the chemical liquid. Therefore, it is possible to selectively process the outer peripheral end of the substrate with the chemical liquid.

As a result, it is possible to precisely process the outer peripheral end of the substrate with the chemical liquid.

In a preferred embodiment of the present invention, the protection film forming step includes a high-speed rotating step of rotating the substrate about a rotational axis passing through a central portion of the first principal surface at first speed in a state where the protection film formation liquid is attached to the first principal surface. The substrate processing method further includes a spin-drying step of rotating the substrate at second speed that is lower than the first speed and drying the substrate after the first chemical liquid supplying step.

According to the present method, in the protection film forming step, the substrate is rotated at the first speed that is higher than the second speed at the time of drying the substrate in a state where the protection film formation liquid is attached to the first principal surface. Therefore, it is possible to suppress the protection film formation liquid on the first principal surface from reaching the second peripheral edge portion via the outer peripheral end.

In a preferred embodiment of the present invention, the first chemical liquid supplying step includes a low-speed rotating step of rotating the substrate at third speed that is lower than the first speed and the second speed while supplying the chemical liquid to the second principal surface.

According to the present method, the substrate is rotated at the first speed that is higher than the third speed in the first chemical liquid supplying step in a state where the protection film formation liquid is attached to the first principal surface. Therefore, it is possible to furthermore suppress the protection film formation liquid on the first principal surface from reaching the second peripheral edge portion via the outer peripheral end.

In a preferred embodiment of the present invention, the protection film removing step may include a removing liquid supplying step of supplying a removing liquid that removes the protection film to the first principal surface. In addition, the protection film removing step may include a light irradiating step of irradiating light to the first principal surface.

In a preferred embodiment of the present invention, the protection film forming step includes a step of forming the protection film in the first peripheral edge portion so that an inner side region adjacent to the first peripheral edge portion is exposed in the first principal surface.

Therefore, in comparison to a case of formation over the entire first principal surface, it is possible to reduce a use amount of the protection film formation liquid, and also decrease a region where the protection film is formed in the first principal surface. In addition, since the protection film is not formed in the inner side region adjacent to the first peripheral edge portion in the first principal surface, it is possible to prevent in advance that the protection film remains in the inner side region as a residue after the protection film removing step.

In a preferred embodiment of the present invention, the first chemical liquid supplying step includes a step of allowing the chemical liquid to reach the first peripheral edge portion from the second principal surface via the outer peripheral end. An inner peripheral end of the protection film formed in the protection film forming step is placed on the inner side of a position where the chemical liquid reaches in the first peripheral edge portion of the first principal surface.

Therefore, even in a case where the protection film is formed so that the region on the inner side of the first peripheral edge portion is exposed, it is also possible to suppress with high reliability the chemical liquid from reaching the inner side of the inner peripheral end of the protection film.

In a preferred embodiment of the present invention, the protection film forming step includes a step of forming the protection film over the entire first principal surface. According to the present method, it is possible to protect the entire first principal surface from the chemical liquid.

In a preferred embodiment of the present invention, the substrate processing method further includes a second chemical liquid supplying step of supplying a chemical liquid toward a front surface of the protection film during supply of the chemical liquid to the second principal surface in the first chemical liquid supplying step. It is possible to wash particles, etc., attached to the front surface of the protection film away with the chemical liquid. Therefore, when the protection film is removed by the protection film removing step, it is possible to suppress the first principal surface from being contaminated by the particles, etc., attached to the protection film.

In a preferred embodiment of the present invention, the protection film forming step may include a polymer film forming step of forming a polymer film containing polymer as the protection film by supplying a polymer-containing liquid containing polymer to the first principal surface as the protection film formation liquid. In addition, the protection film forming step may include a hydrophobic film forming step of forming a hydrophobic film as the protection film by supplying a hydrophobizing liquid to the first principal surface as the protection film formation liquid.

Another preferred embodiment of the present invention provides a substrate processing apparatus that processes a substrate having a first principal surface that has a first peripheral edge portion, a second principal surface that is a surface on the opposite side of the first principal surface, the second principal surface having a second peripheral edge portion, and an outer peripheral end that couples the first peripheral edge portion and the second peripheral edge portion.

The substrate processing apparatus includes a protection film forming member that supplies a protection film formation liquid to the first principal surface, and forms a protection film in the first peripheral edge portion, a chemical liquid supplying member that supplies a chemical liquid to the second principal surface, and processes the second principal surface and the outer peripheral end with the chemical liquid in a state where the protection film is formed in the first peripheral edge portion, and a protection film removing unit that removes the protection film.

DESCRIPTION OF EMBODIMENTS

Hereinafter, preferred embodiments of the present invention will be described with reference to the attached drawings.

<Arrangement of Substrate Processing Apparatus According to First Preferred Embodiment>

Figure 1:
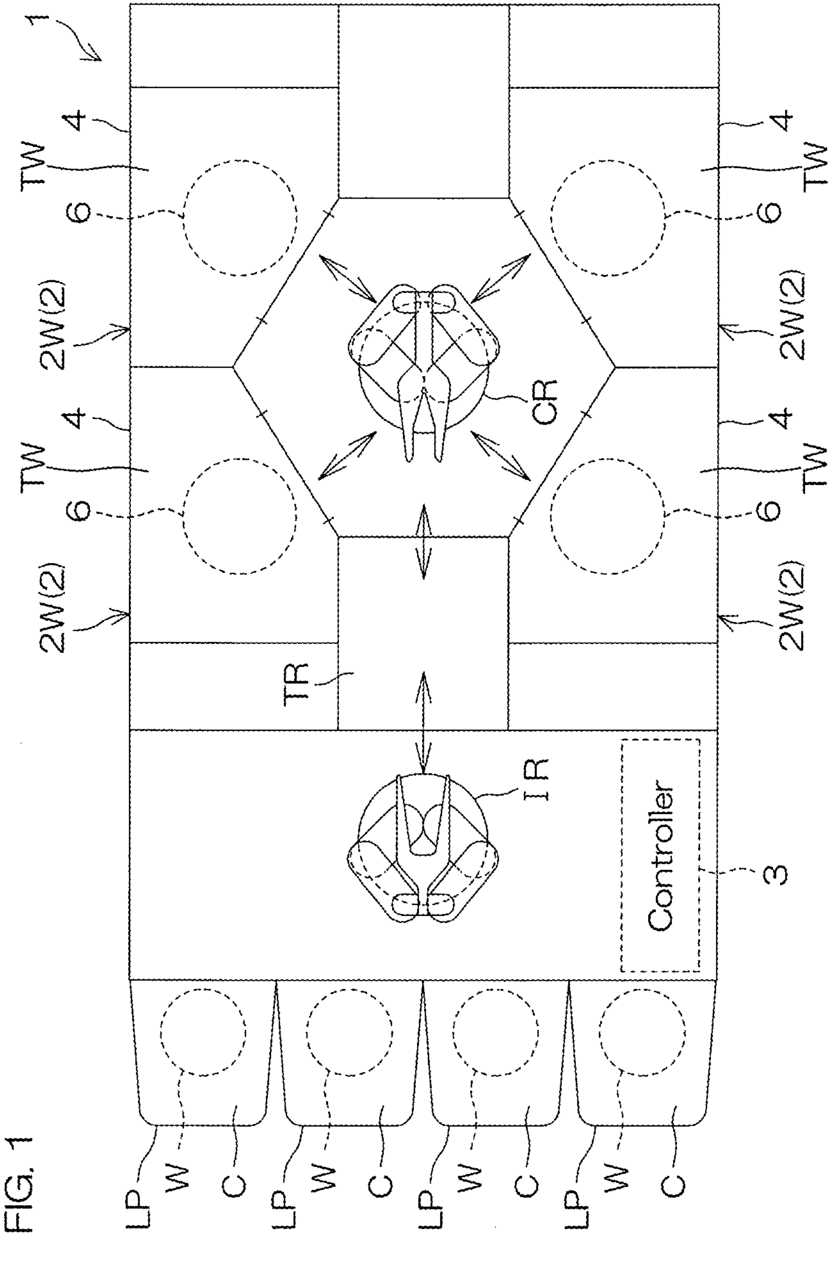
FIG. 1 is a plan view for describing an arrangement example of a substrate processing apparatus according to a first preferred embodiment of the present invention.

FIG. 1 is a plan view for describing an arrangement example of a substrate processing apparatus 1 according to a first preferred embodiment of the present invention.

The substrate processing apparatus 1 is a single substrate processing type apparatus that processes substrates W one by one. In the preferred embodiment, the substrates W have a disk shape. Each of the substrates W is a substrate such as a silicon wafer and has a pair of principal surfaces.

The substrate processing apparatus 1 includes a plurality of processing units 2 that process the substrates W, load ports LP (container holding units) on which carriers C (containers) that house the plurality of substrates W to be processed by the processing units 2 are mounted, transfer robots (of a first transfer robot IR and a second transfer robot CR) that transfer the substrates W between the load ports LP and the processing units 2, and a controller 3 that controls members provided in the substrate processing apparatus 1.

The first transfer robot IR transfers the substrate W between the carrier C and the second transfer robot CR. The second transfer robot CR transfers the substrate W between the first transfer robot IR and the processing unit 2. Each of the transfer robots is, for example, an articulated arm robot.

The plurality of processing units 2 are aligned on both the sides of a transfer route TR in which the substrate W is transferred by the second transfer robot CR along the transfer route TR, and also aligned to be stacked in the up and down direction.

The plurality of processing units 2 form four processing towers TW respectively disposed at four positions that are horizontally separate from each other. Each of the processing towers TW includes the plurality of processing units 2 stacked in the up and down direction. Each two of the processing towers TW are disposed on each of both the sides of the transfer route TR.

The processing unit 2 is a wet processing unit 2W that processes the substrate W with a processing liquid. Although details will be described later, the processing liquid includes a protection film formation liquid, an etching liquid, a rinsing liquid, and a removing liquid. The processing unit 2 includes a chamber 4 that houses the substrate W at the time of substrate processing.

The chamber 4 includes an inlet/outlet (not shown) for carrying the substrate W into the chamber 4 and carrying the substrate W out from the chamber 4, and a shutter unit (not shown) that opens and closes the inlet/outlet. The wet processing unit 2W includes a processing cup 6 disposed in the chamber 4, and processes the substrate W in the processing cup 6.

Figure 2:
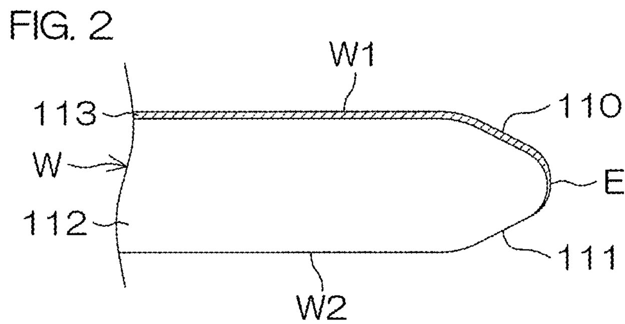
FIG. 2 is a schematic view for describing a structure of a substrate to be processed by the substrate processing apparatus.

FIG. 2 is a schematic view for describing a structure of the substrate W to be processed by the substrate processing apparatus 1.

The substrate W has a pair of principal surfaces (of a first principal surface W1 and a second principal surface W2), and an outer peripheral end E that couples peripheral edge portions (of a first peripheral edge portion 110 and a second peripheral edge portion 111) of the pair of principal surfaces. Each of the principal surfaces may have a circular flat portion and an annular inclined portion coupled to the flat portion and inclined with respect to the flat portion. The peripheral edge portion of the principal surface is arranged by, for example, the entire inclined portion and a part of the flat portion adjacent to the inclined portion.

The shape of the outer peripheral end E is not restricted. However, in the present preferred embodiment, the outer peripheral end E has an arc-shaped section expanding toward the outside of the substrate W.

The principal surface may be a device surface where a device having a concavo-convex pattern is formed, or may be a non-device surface where no device is formed.

The pair of principal surfaces are arranged by the first principal surface W1 and the second principal surface W2 that is a surface on the opposite side of the first principal surface W1. The peripheral edge portion of the first principal surface W1 is called the first peripheral edge portion 110, and the peripheral edge portion of the second principal surface W2 is called the second peripheral edge portion 111. The outer peripheral end E couples the first peripheral edge portion 110 and the second peripheral edge portion 111.

In the present preferred embodiment, the first principal surface W1 is the device surface, and the second principal surface W2 is the non-device surface.

The substrate W has a foundation layer 112, and a most superficial foundation layer 113 formed on the foundation layer 112 and exposed from the first principal surface W1 and the outer peripheral end E. The most superficial foundation layer 113 is, for example, an insulator layer or a metal layer. The foundation layer 112 has, for example, a stacked structure, and is arranged by at least any of a semiconductor layer, an insulator layer, and a metal layer. The foundation layer 112 may have, for example, a single layer structure arranged by a semiconductor layer.

The insulator layer is, for example, silicon oxide ($SiO_2$) or silicon nitride (SiN). The metal layer is, for example, tungsten (W). The semiconductor layer is, for example, silicon (Si).

Hereinafter, an example that an upper surface (upper principal surface) is the first principal surface W1 and a lower surface (lower principal surface) is the second principal surface W2 will be described unless otherwise described.

<Arrangement of Wet Processing Unit According to First Preferred Embodiment>

Figure 3:
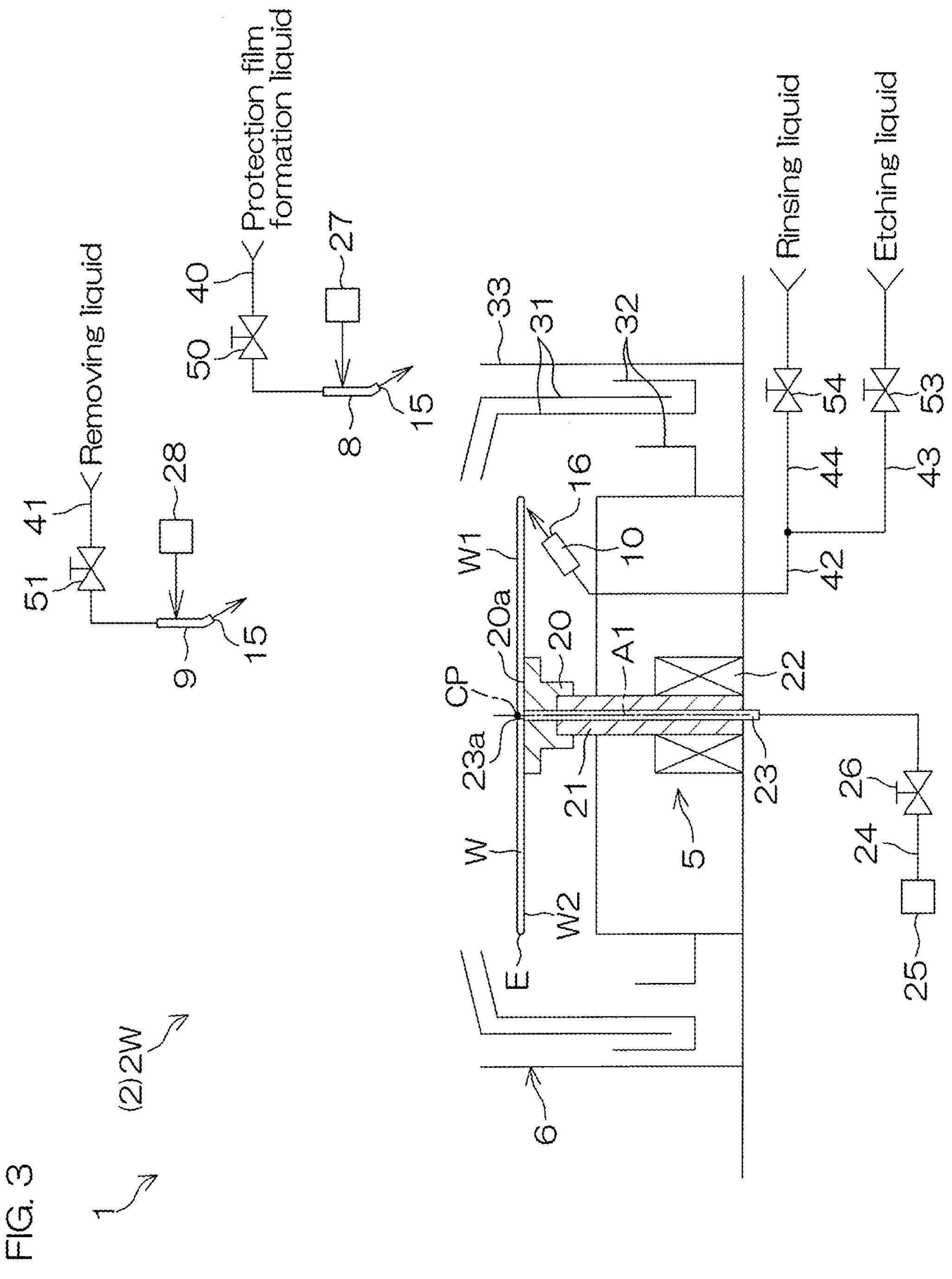
FIG. 3 is a schematic view for describing an arrangement of a wet processing unit provided in the substrate processing apparatus.

FIG. 3 is a schematic view for describing an arrangement of the wet processing unit 2W.

The wet processing unit 2W further includes a spin chuck 5 that rotates the substrate W about a rotational axis A1 while holding the substrate W in a predetermined first processing posture, a plurality of upper surface processing liquid nozzles (of a protection film formation liquid nozzle 8 and a removing liquid nozzle 9) that discharge processing liquids to the upper surface (first principal surface W1) of the substrate W held by the spin chuck 5, and a lower surface processing liquid nozzle 10 that selectively discharges the etching liquid and the rinsing liquid toward the lower surface (second principal surface W2) of the substrate W held by the spin chuck 5.

The spin chuck 5, the plurality of upper surface processing liquid nozzles, and the lower surface processing liquid nozzle 10 are disposed in the chamber 4.

The rotational axis A1 passes through a central portion CP of the upper surface of the substrate W, and is orthogonal to each of the principal surfaces of the substrate W held in the first processing posture. In the present preferred embodiment, the first processing posture is a horizontal posture in which the principal surface of the substrate W becomes a horizontal surface. The horizontal posture is a posture of the substrate W shown in FIG. 3, and in a case where the first processing posture is the horizontal posture, the rotational axis A1 extends vertically.

The spin chuck 5 is surrounded by the processing cup 6. The spin chuck 5 includes a spin base 20 that suctions onto the lower surface of the substrate W and holds the substrate W in the first processing posture, a rotation shaft 21 extending along the rotational axis A1, the rotation shaft being combined with the spin base 20, and a rotary driving mechanism 22 that rotates the rotation shaft 21 about the rotational axis A1.

The spin base 20 has a suction surface 20*a* that suctions onto the lower surface of the substrate W. The suction surface 20*a* is, for example, an upper surface of the spin base 20, and a circular surface in which the rotational axis A1 passes through a central portion. A diameter of the suction surface 20*a* is smaller than a diameter of the substrate W. An upper end portion of the rotation shaft 21 is combined with the spin base 20.

A suction route 23 is inserted into the spin base 20 and the rotation shaft 21. The suction route 23 has a suction port 23*a* exposed from the center of the suction surface 20*a* of the spin base 20. The suction route 23 is coupled to a suction pipe 24. The suction pipe 24 is coupled to a suction device 25 such as a vacuum pump. The suction device 25 may arrange part of the substrate processing apparatus 1, or may be a device that is different from the substrate processing apparatus 1 provided in a facility in which the substrate processing apparatus 1 is installed.

A suction valve 26 that opens and closes the suction pipe 24 is provided in the suction pipe 24. By opening the suction valve 26, the substrate W disposed on the suction surface 20*a* of the spin base 20 is suctioned to the suction port 23*a* of the suction route 23. Thereby, the substrate W is suctioned onto the suction surface 20*a* from the lower side, and held in the first processing posture.

By rotating the rotation shaft 21 by the rotary driving mechanism 22, the spin base 20 is rotated. Thereby, the substrate W is rotated about the rotational axis A1 together with the spin base 20.

The spin base 20 is an example of a substrate holding member that holds the substrate W in the predetermined first processing posture (horizontal posture). The spin chuck 5 is an example of a rotation holding unit that rotates the substrate W about the rotational axis A1 while holding the substrate W in the predetermined first processing posture (horizontal posture). The spin chuck 5 is also called a suction rotating unit that rotates the substrate W while suctioning the substrate W onto the suction surface 20*a*.

The plurality of upper surface processing liquid nozzles include the protection film formation liquid nozzle 8 that discharges a continuous flow of the protection film formation liquid toward the upper surface of the substrate W held by the spin chuck 5, and the removing liquid nozzle 9 that discharges a continuous flow of the removing liquid toward the upper surface of the substrate W held by the spin chuck 5. Each of the upper surface processing liquid nozzles has a discharge port 15 from which the processing liquid is discharged obliquely with respect to the upper surface of the substrate W.

The plurality of upper surface processing liquid nozzles are moved in the direction (horizontal direction) along the upper surface of the substrate W respectively by a plurality of nozzle driving mechanisms (of a first nozzle driving mechanism 27 and a second nozzle driving mechanism 28). The nozzle driving mechanisms can move the corresponding upper surface processing liquid nozzles between a central position and a retreat position. Each of the nozzle driving mechanisms can also dispose the corresponding upper surface processing liquid nozzle at a peripheral edge position.

The central position is a position where the discharge port 15 of the upper surface processing liquid nozzle opposes the rotation center (central portion CP) of the upper surface of the substrate W. The retreat position is a position where the discharge port 15 of the upper surface processing liquid nozzle does not oppose the upper surface of the substrate W, the position being on the outer side of the processing cup 6. The peripheral edge position is a position where the discharge port 15 of the upper surface processing liquid nozzle opposes the peripheral edge portions of the upper surface of the substrate W.

Each of the nozzle driving mechanisms includes an arm (not shown) that supports the corresponding upper surface processing liquid nozzle, and an arm driving mechanism (not shown) that moves the arm in the direction (horizontal direction) along the upper surface of the substrate W. The arm driving mechanism includes an actuator such as an electric motor and an air cylinder.

Each of the upper surface processing liquid nozzles may be a turning type nozzle that turns about a predetermined turn axis, or may be a direct-acting type nozzle that linearly moves in the direction in which the arm extends. The upper surface processing liquid nozzle may be arranged so as to move in the vertical direction as well. The other nozzle movement mechanisms to be described later also have the same arrangement.

The protection film formation liquid discharged from the protection film formation liquid nozzle 8 is a polymer-containing liquid that contains polymer and a solvent. The protection film formation liquid nozzle 8 is also called a polymer-containing liquid nozzle.

The polymer contained in the protection film formation liquid has dissolubility with respect to the etching liquid that is lower than dissolubility with respect to the removing liquid. The polymer has dissolubility with respect to the rinsing liquid that is lower than the dissolubility with respect to the removing liquid. In other words, the polymer has a property of being more easily dissolved into the removing liquid than into the etching liquid and the rinsing liquid.

The polymer contained in the protection film formation liquid includes, for example, acryl resin, phenol resin, epoxy resin, melamine resin, urea resin, unsaturated polyester resin, alkyd resin, polyurethane, polyimide, polyethylene, polypropylene, polyvinyl chloride, polystyrene, polyvinyl acetate, polytetrafluoroethylene, acrylonitrile-butadiene-styrene resin, acrylonitrile styrene resin, polyamide, polyacetal, polycarbonate, polyvinyl alcohol, modified polyphenylene ether, polybutylene telephthalate, polyethylene terephthalate, polyphenylene sulfide, polysulfone, polyetheretherketone, and polyamide imide. The polymer may be a mixture of these.

The solvent contained in the protection film formation liquid has a property of dissolving the polymer. The solvent contains, for example, an organic solvent such as isopropanol (IPA).

The solvent contains, at least one type of alcohols such as ethanol (EtOH) and IPA, ethylene glycol monoalkyl ethers such as ethylene glycol monomethyl ether and ethylene glycol monoethyl ether, ethylene glycol monoalkyl ether acetates such as ethylene glycol monomethyl ether acetate and ethylene glycol monoethyl ether acetate, propylene glycol monoalkyl ethers such as propylene glycol monomethyl ether (PGME) and propylene glycol monoethyl ether (PGEE), lactate esters such as methyl lactate and ethyl lactate (EL), aromatic hydrocarbons such as toluene and xylene, and ketons such as acetone, methyl ethyl ketone, 2-heptanone, and cyclohexanone.

The protection film formation liquid nozzle 8 is connected to a protection film formation liquid pipe 40 through which the protection film formation liquid is guided to the protection film formation liquid nozzle 8. A protection film formation liquid valve 50 that opens and closes the protection film formation liquid pipe 40 is provided in the protection film formation liquid pipe 40. When the protection film formation liquid valve 50 is opened, the continuous flow of the protection film formation liquid is discharged from the protection film formation liquid nozzle 8.

Providing the protection film formation liquid valve 50 in the protection film formation liquid pipe 40 may mean that the protection film formation liquid valve 50 is placed on the protection film formation liquid pipe 40. The same applies to the other valves to be described later.

Although not shown, the protection film formation liquid valve 50 includes a valve body inside which a valve seat is provided, a valve element that opens and closes the valve seat, and an actuator that moves the valve element between an open position and a closed position. The other valves also have the same arrangement.

By evaporation of at least part of the solvent from the protection film formation liquid supplied to the upper surface of the substrate W, the protection film formation liquid on the substrate W is changed to a semisolid-state or solid-state polymer film.

The semisolid state is a state where a solid component and a liquid component are mixed, or a state where the film has such viscosity that the film can maintain a fixed shape on the substrate W. The solid state is a state where a liquid component is not contained and the film is arranged only by a solid component. Therefore, the polymer film does not spread on the upper surface of the substrate W but stays at a position where the polymer film is formed. The polymer film in which the solvent remains is called a semisolid film, and the polymer film in which the solvent completely vanishes is called a solid film. The polymer film is an example of a protection film.

The removing liquid discharged from the removing liquid nozzle 9 is a liquid that removes the polymer film from the upper surface of the substrate W by dissolving the polymer film. The removing liquid is a liquid into which the polymer film is more easily dissolved than the etching liquid and the rinsing liquid. The polymer film remaining on the upper surface of the substrate W may be removed from the upper surface of the substrate W by being pushed to the outside of the substrate W by energy acting from a liquid flow of the removing liquid.

The removing liquid discharged from the removing liquid nozzle 9 is, for example, an organic solvent such as IPA. As the removing liquid, it is possible to use the liquids listed as the organic solvent to be used as the solvent of the polymer-containing liquid. That is, as the removing liquid, it is possible to use the same type of liquid as the solvent of the protection film formation liquid. In addition, as the removing liquid, ozone water having oxidizing power with which an organic substance such as polymer is removed may be used.

The removing liquid nozzle 9 is connected to a removing liquid pipe 41 through which the removing liquid is guided to the removing liquid nozzle 9. A removing liquid valve 51 that opens and closes the removing liquid pipe 41 is provided in the removing liquid pipe 41. When the removing liquid valve 51 is opened, the continuous flow of the removing liquid is discharged from the removing liquid nozzle 9.

The lower surface processing liquid nozzle 10 selectively discharges a continuous flow of the etching liquid and a continuous flow of the rinsing liquid toward the lower surface of the substrate W held by the spin chuck 5.

The etching liquid to be discharged from the lower surface processing liquid nozzle 10 is a liquid that etches the substrate W. The etching liquid contains, for example, hydrogen peroxide solution ($H_2O_2$), ozone water, hydrofluoric acid (HF), diluted hydrofluoric acid (DHF), buffered hydrofluoric acid (BHF), hydrochloric acid (HCl), HPM liquid (hydrochloric acid-hydrogen peroxide mixture), SPM liquid (sulfuric acid/hydrogen peroxide mixture), ammonia water, TMAH liquid (tetramethylammonium hydroxide solution), APM liquid (ammonia-hydrogen peroxide mixture), FPM liquid (hydrofluoric acid-hydrogen peroxide mixture), or FOM liquid (hydrofluoric acid-ozone mixture).

The rinsing liquid to be discharged from the lower surface processing liquid nozzle 10 is a liquid that rinses the upper surface of the substrate W and removes the etching liquid from the upper surface of the substrate W. The rinsing liquid is, for example, water such as DIW. However, the rinsing liquid is not restricted to DIW. The rinsing liquid may be, for example, carbonated water, electrolyzed ion water, aqueous hydrochloric acid solution of diluted concentration (for example of not less than 1 ppm and not more than 100 ppm), ammonia water of diluted concentration (for example of not less than 1 ppm and not more than 100 ppm), or reduced water (hydrogen water).

The lower surface processing liquid nozzle 10 is connected to a lower surface processing liquid pipe 42 through which the processing liquid is guided to the lower surface processing liquid nozzle 10. A lower surface etching liquid pipe 43 through which the etching liquid is supplied to the lower surface processing liquid pipe 42, and a lower surface rinsing liquid pipe 44 through which the rinsing liquid is supplied to the lower surface processing liquid pipe 42 are connected to the lower surface processing liquid pipe 42. The lower surface processing liquid pipe 42 may be connected to the lower surface etching liquid pipe 43 and the lower surface rinsing liquid pipe 44 via a mixing valve (not shown).

A lower surface etching liquid valve 53 that opens and closes the lower surface etching liquid pipe 43 is provided in the lower surface etching liquid pipe 43. A lower surface rinsing liquid valve 54 that opens and closes the lower surface rinsing liquid pipe 44 is provided in the lower surface rinsing liquid pipe 44.

A position of the lower surface processing liquid nozzle 10 with respect to the spin chuck 5 is fixed. The lower surface processing liquid nozzle 10 has a discharge port 16 that faces the peripheral edge portion of the lower surface of the substrate W. When the lower surface etching liquid valve 53 is opened, the continuous flow of the etching liquid is discharged from the lower surface processing liquid nozzle 10 toward the peripheral edge portion of the lower surface of the substrate W. When the lower surface rinsing liquid valve 54 is opened, the continuous flow of the rinsing liquid is discharged from the lower surface processing liquid nozzle 10 toward the peripheral edge portion of the lower surface of the substrate W.

The lower surface processing liquid nozzle 10 is only required to supply the processing liquid to the lower surface of the substrate W but is not always required to discharge toward the peripheral edge portion of the lower surface of the substrate W.

An arrangement of the processing cup 6 is not particularly restricted. The processing cup 6 includes, for example, a plurality of (two in FIG. 3) guards 31 that receive the processing liquid scattering outward from the substrate W that is held by the spin chuck 5, a plurality of (two in FIG. 3) cups 32 that respectively receive the processing liquid guided downward by the plurality of guards 31, and a cylindrical outer wall member 33 surrounding the plurality of guards 31 and the plurality of cups 32.

Each of the guards 31 has a tubular form surrounding the spin chuck 5 in the normal direction with respect to the flat portion of the first principal surface W1 of the substrate W (hereinafter, simply referred to as "plan view"). An upper end portion of each of the guard 31 is inclined to head to the inner side of the guard 31. Each of the cups 32 has an annular groove form that is open upward. The plurality of guards 31 and the plurality of cups 32 are disposed on the same axis.

The plurality of guards 31 are individually elevated and lowered by a guard elevating and lowering driving mechanism (not shown). The guard elevating and lowering driving mechanism includes, for example, a plurality of actuators that respectively drive to elevate and lower the plurality of guards 31. The plurality of actuators include at least one of an electric motor and an air cylinder.

<Electrical Configuration of Substrate Processing According to First Preferred Embodiment>

Figure 4:
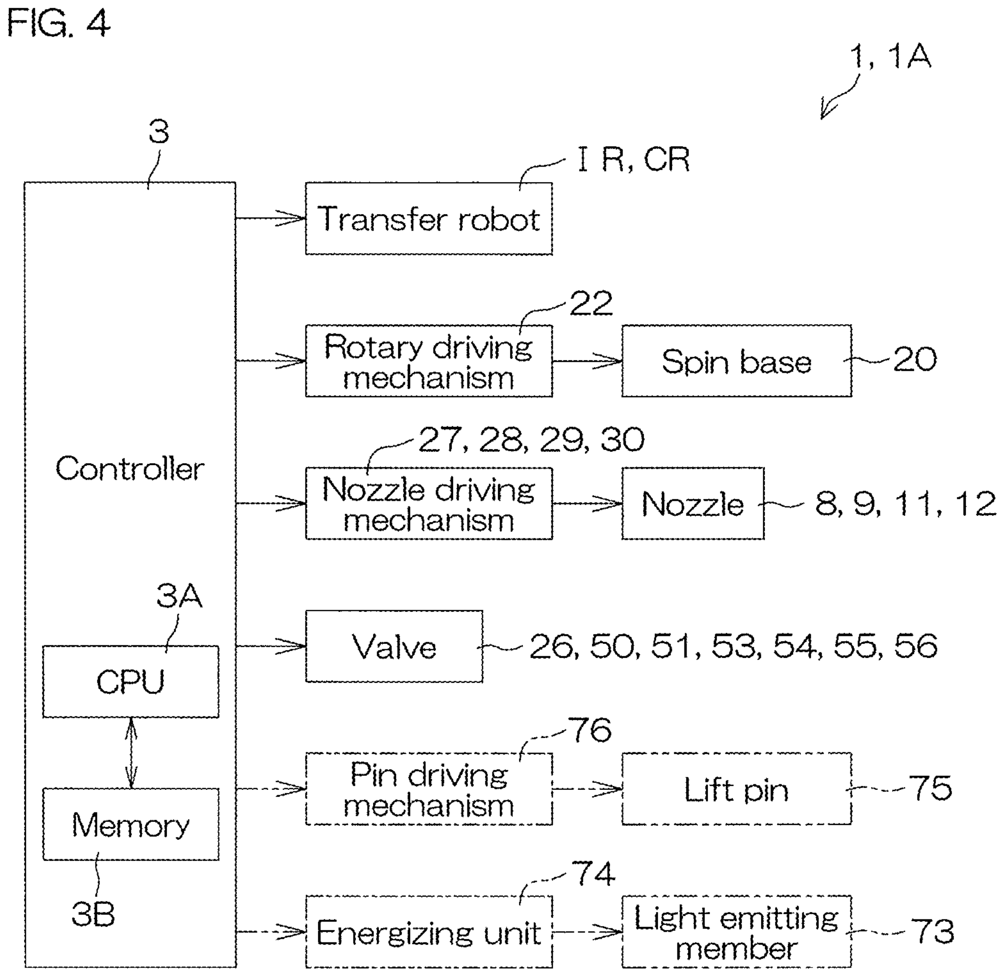
FIG. 4 is a block diagram for describing an electrical configuration of the substrate processing apparatus.

FIG. 4 is a block diagram for describing an electrical configuration of the substrate processing apparatus 1. The controller 3 includes a microcomputer and controls objects to be controlled provided in the substrate processing apparatus 1 according to a predetermined control program.

Specifically, the controller 3 includes a processor 3A (CPU), and a memory 3B in which the control program is stored. The controller 3 is arranged to execute various controls for the substrate processing by executing the control program by the processor 3A.

In particular, the controller 3 is programmed to control the first transfer robot IR, the second transfer robot CR, the rotary driving mechanism 22, the first nozzle driving mechanism 27, the second nozzle driving mechanism 28, the suction valve 26, the protection film formation liquid valve 50, the removing liquid valve 51, the lower surface etching liquid valve 53, the lower surface rinsing liquid valve 54, etc.

Steps shown below are executed by controlling the members provided in the substrate processing apparatus 1 by the controller 3. In other words, the controller 3 is programmed to execute the steps shown below.

In addition, although FIG. 4 shows representative members, it does not mean that members that are not shown in the figure are not controlled by the controller 3, and the controller 3 can properly control the members provided in the substrate processing apparatus 1. FIG. 4 also shows members to be described later in a modified example and a second preferred embodiment, and these members are also controlled by the controller 3.

<Example of Substrate Processing>

Figure 5:
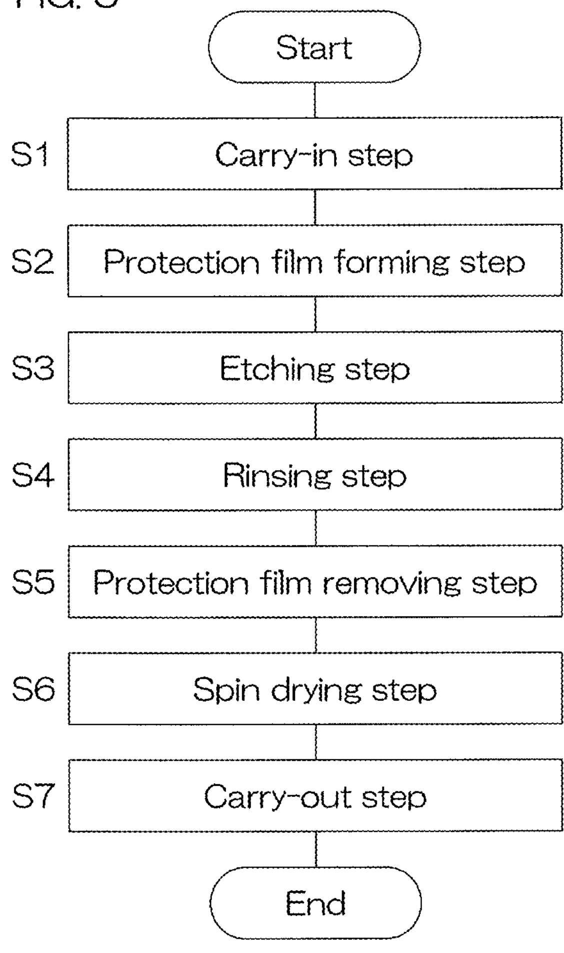
FIG. 5 is a flowchart for describing an example of substrate processing to be executed by the substrate processing apparatus.

FIG. 5 is a flowchart for describing an example of the substrate processing to be executed by the substrate processing apparatus 1. FIG. 6A to FIG. 6D are schematic views for describing states of the first peripheral edge portion 110 of the first principal surface W1 of the substrate W during the substrate processing.

In the substrate processing by the substrate processing apparatus 1, for example, as shown in FIG. 5, a carry-in step (Step S1), a protection film forming step (Step S2), an etching step (Step S3), a rinsing step (Step S4), a protection film removing step (Step S5), a spin-drying step (Step S6), and a carry-out step (Step S7) are executed.

Hereinafter, details of the substrate processing will be described mainly with reference to FIG. 3 and FIG. 5, and appropriately with reference to FIG. 6A to FIG. 6D.

First, the not-yet-processed substrate W is carried into the wet processing unit 2W from the carrier C by the second transfer robot CR (see FIG. 1), and handed over to the spin chuck 5 (carry-in step: Step S1). Thereby, the substrate W is held in the first processing posture by the spin chuck 5 (substrate holding step). At the time, the substrate W is held by the spin chuck 5 so that the first principal surface W1 is the upper surface. The spin chuck 5 starts rotating the substrate W while holding the substrate W (substrate rotating step).

After the second transfer robot CR is retreated from the chamber 4, the protection film forming step (Step S2) of forming a polymer film 100 (see FIG. 6B) serving as the protection film in the first peripheral edge portion 110 of the first principal surface W1 of the substrate W is executed.

Figure 6A:
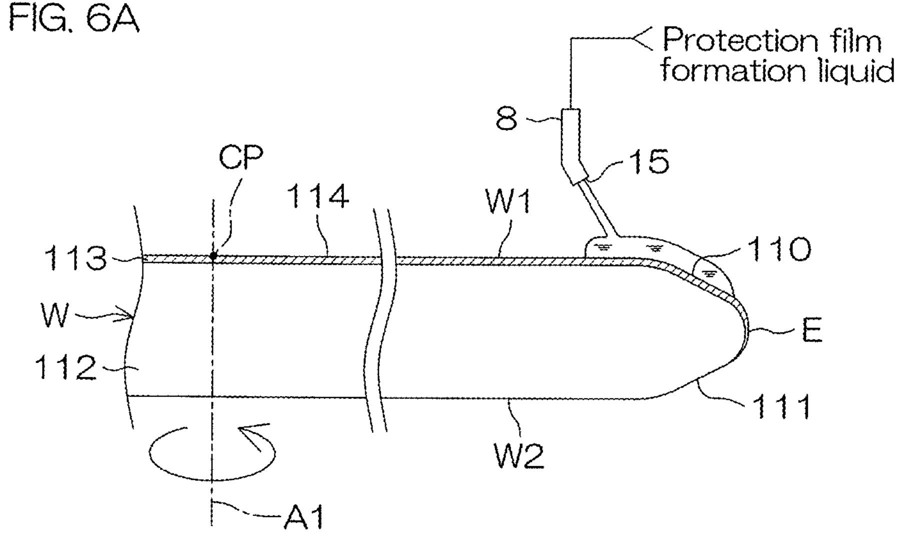
FIG. 6A is a schematic view for describing a state of a peripheral edge portion of an upper surface of the substrate during the substrate processing.

Specifically, the first nozzle driving mechanism 27 moves the protection film formation liquid nozzle 8 to the peripheral edge position. In a state where the protection film formation liquid nozzle 8 is placed at the peripheral edge position, the protection film formation liquid valve 50 is opened. Thereby, as shown in FIG. 6A, the protection film formation liquid is supplied (discharged) from the protection film formation liquid nozzle 8 toward the first peripheral edge portion 110 of the first principal surface W1 (protection film formation liquid supplying step, protection film formation liquid discharging step). The protection film formation liquid nozzle 8 is an example of a protection film formation liquid discharging member.

The protection film formation liquid discharged from the protection film formation liquid nozzle 8 lands on the first peripheral edge portion 110 of the first principal surface W1 of the substrate W. The protection film formation liquid on the substrate W moves toward the outer peripheral end E of the substrate W by a centrifugal force due to rotation of the substrate W. Thereby, the first peripheral edge portion 110 of the first principal surface W1 is covered by the protection film formation liquid so that a region on the inner side of the first peripheral edge portion 110 (inner side region 114) is exposed in the first principal surface W1 of the substrate W (peripheral edge covering step). The inner side region 114 is a region adjacent to the first peripheral edge portion 110, the region including the central portion CP and a peripheral portion thereof.

After discharge of the protection film formation liquid is stopped, by continuing the rotation of the substrate W, part of the protection film formation liquid on the substrate W scatters to the outside of the substrate W from the outer peripheral end E of the substrate W. Thereby, a liquid film of the protection film formation liquid on the substrate W is thinned (spin-off step, film thinning step). After the protection film formation liquid valve 50 is closed, the protection film formation liquid nozzle 8 is moved to the retreat position by the first nozzle driving mechanism 27.

Figure 6B:
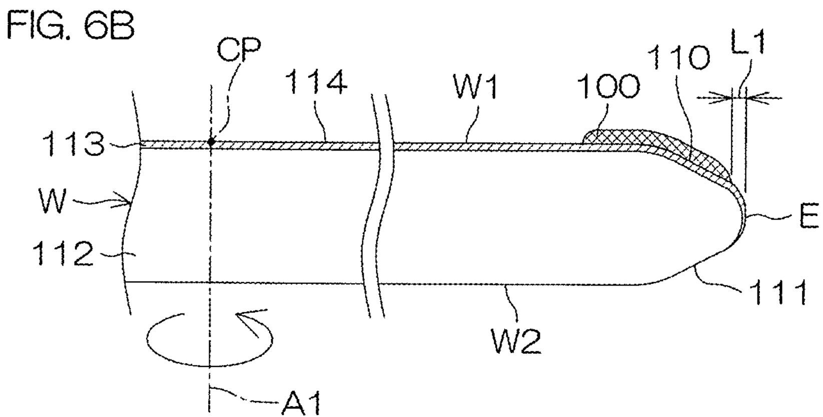
FIG. 6B is a schematic view for describing a state of the peripheral edge portion of the upper surface of the substrate during the substrate processing.

The centrifugal force due to the rotation of the substrate W acts not only on the protection film formation liquid on the substrate W but also on a gas in contact with the protection film formation liquid on the substrate W. Therefore, by the action of the centrifugal force, a radial airflow in which the gas runs from the central portion CP toward the outer peripheral end E is formed. By the airflow, the gas-state solvent in contact with the protection film formation liquid on the substrate W is removed from an atmosphere in contact with the substrate W. Therefore, evaporation (volatilization) of the solvent from the protection film formation liquid on the substrate W is facilitated, and as shown in FIG. 6B, the polymer film 100 is formed (evaporation forming step, polymer film forming step). The protection film formation liquid nozzle 8 functions as a protection film forming member (polymer film forming member).

In the protection film forming step, the rotation of the substrate W is accelerated at predetermined protection film forming acceleration, and rotation speed of the substrate W reaches protection film forming speed (first speed) (high-speed rotating step). The protection film forming speed is, for example, not less than 1,500 rpm and not more than 4,000 rpm. The protection film forming acceleration is, for example, not less than 150 rad/sec$^2$ and not more than 2,000 rad/sec$^2$. Regarding the substrate W, in the protection film forming step, the rotation speed of the substrate W may reach the protection film forming speed before stopping supply of the protection film formation liquid, or may reach the protection film forming speed after stopping the supply of the protection film formation liquid.

The polymer film 100 covers the first peripheral edge portion 110 of the first principal surface W1 of the substrate W, and has an annular shape. Since the substrate W is rotated at high speed in the protection film forming step, the protection film formation liquid easily scatters from the substrate W and is not easily attached to the outer peripheral end E. Therefore, the polymer film 100 is formed so that the outer peripheral end E is exposed. A width L1 of the outer peripheral end E that is not covered by the polymer film 100 but exposed is preferably, for example, not more than 0.3 mm.

After the protection film forming step, in a state where the polymer film 100 (protection film) is formed in the first peripheral edge portion 110 of the first principal surface W1, the etching step (Step S3) of supplying the etching liquid to the second principal surface W2, allowing the chemical liquid to reach the outer peripheral end E, and etching the outer peripheral end E is executed.

Specifically, the lower surface etching liquid valve 53 is opened. Thereby, the etching liquid is discharged from the lower surface processing liquid nozzle 10 toward the second peripheral edge portion 111 of the second principal surface W2 of the substrate W (first etching liquid supplying step, first chemical liquid discharging step). The etching liquid discharged from the lower surface processing liquid nozzle 10 lands on the second peripheral edge portion 111.

The etching liquid on the second principal surface W2 moves toward the outer peripheral end E of the substrate W by the centrifugal force due to the rotation of the substrate W, and reaches the outer peripheral end E. The etching liquid scatters from the outer peripheral end E of the substrate W by the centrifugal force.

Figure 6C:
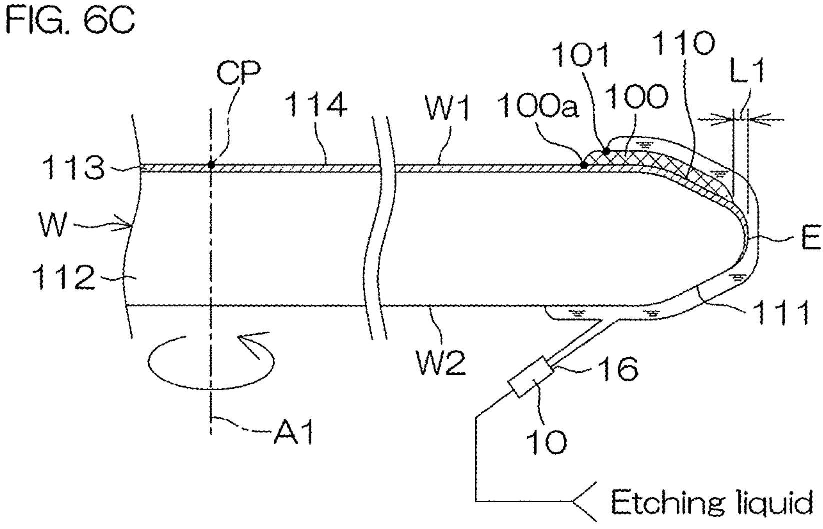
FIG. 6C is a schematic view for describing a state of the peripheral edge portion of the upper surface of the substrate during the substrate processing.

As shown in FIG. 6C, at least part of the etching liquid runs down the outer peripheral end E of the substrate W and is supplied to the first peripheral edge portion 110 of the first principal surface W1. The etching liquid does not reach an inner peripheral end 100*a* of the polymer film 100 in the first peripheral edge portion 110 of the first principal surface W1 but stays on the outer side of the inner peripheral end 100*a*. The inner peripheral end 100*a* of the polymer film 100 is placed on the inner side of a position where the etching liquid reaches (inner peripheral end 101 of the etching liquid). Thereby, the outer peripheral end E of the substrate W is etched.

In such a way, in a state where the polymer film 100 is formed in the first peripheral edge portion 110, the etching liquid is supplied to the second principal surface W2 and the outer peripheral end E is processed with the etching liquid (first etching liquid supplying step, first chemical liquid supplying step). The lower surface processing liquid nozzle 10 is an example of a first chemical liquid supplying member.

When the outer peripheral end E is processed with the etching liquid, the first peripheral edge portion 110 of the first principal surface W1 is protected by the polymer film 100. Therefore, even when the etching liquid on the second principal surface W2 runs down the second peripheral edge portion 111 and the outer peripheral end E and reaches the first peripheral edge portion 110, it is possible to suppress the first peripheral edge portion 110 from being processed with the etching liquid. Therefore, it is possible to selectively process the outer peripheral end E of the substrate W with the etching liquid. As a result, it is possible to precisely process the outer peripheral end E of the substrate W with the etching liquid.

The width L1 of the outer peripheral end E that is not covered by the polymer film 100 but exposed corresponds to a width of a part to be etched in the substrate W, that is, an etching width.

In the etching step, the rotation of the substrate W is decelerated, and the rotation speed of the substrate W reaches etching rotation speed (third speed) (low-speed rotating step). The etching rotation speed is, for example, not less than 500 rpm and not more than 1,500 rpm. When the etching rotation speed is 1,500 rpm, the protection film forming speed is preferably more than 1,500 rpm and not more than 4,000 rpm.

Next, the rinsing step (Step S4) of supplying the rinsing liquid to the second principal surface W2 and removing the etching liquid from the substrate W is executed.

Specifically, by closing the lower surface etching liquid valve 53, discharge of the etching liquid from the lower surface processing liquid nozzle 10 is stopped. Then, the lower surface rinsing liquid valve 54 is opened, and the rinsing liquid is discharged from the lower surface processing liquid nozzle 10 toward the second peripheral edge portion 111 of the second principal surface W2 (first rinsing liquid discharging step). The rinsing liquid discharged from the lower surface processing liquid nozzle 10 lands on the second peripheral edge portion 111.

The rinsing liquid on the second principal surface W2 spreads toward the outer peripheral end E of the substrate W by the centrifugal force due to the rotation of the substrate W. The rinsing liquid scatters from the outer peripheral end E of the substrate W by the centrifugal force.

Figure 6D:
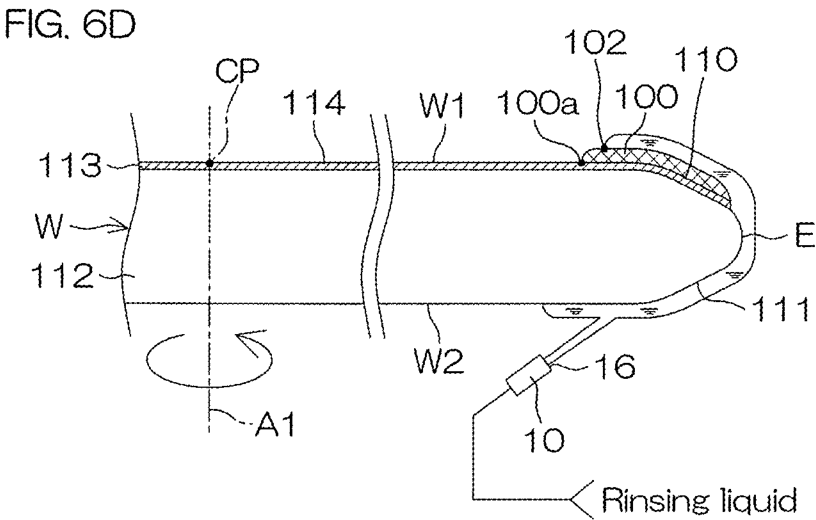
FIG. 6D is a schematic view for describing a state of the peripheral edge portion of the upper surface of the substrate during the substrate processing.

As shown in FIG. 6D, at least part of the rinsing liquid runs down the outer peripheral end E of the substrate W and is supplied to the first peripheral edge portion 110 of the first principal surface W1. The rinsing liquid does not reach the inner peripheral end 100*a* of the polymer film 100 in the first peripheral edge portion 110 of the first principal surface W1 but stays on the outer side of the inner peripheral end 100*a*. The inner peripheral end 100*a* of the polymer film 100 is placed on the inner side of a position where the rinsing liquid reaches (inner peripheral end 102 of the rinsing liquid).

Thereby, the etching liquid attached to a front surface of the polymer film 100, the outer peripheral end E, and the second principal surface W2 is removed to the outside of the substrate W together with the rinsing liquid. Thereby, the etching liquid is removed from the front surface of the polymer film 100, the outer peripheral end E, and the second principal surface W2. The lower surface processing liquid nozzle 10 is an example of a rinsing liquid supplying member that supplies the rinsing liquid to the lower surface of the substrate W and removes the etching liquid from the outer peripheral end E of the substrate W.

In such a way, in a state where the polymer film 100 is formed in the first peripheral edge portion 110, the rinsing liquid is supplied to the second principal surface W2, and the etching liquid is removed from the outer peripheral end E (first rinsing liquid supplying step).

In the rinsing step, the substrate W is rotated at predetermined rinsing rotation speed (fourth speed). The rinsing speed is, for example, not less than 100 rpm and not more than 2,000 rpm. The rinsing rotation speed may be the same speed as the etching rotation speed.

Next, the protection film removing step (Step S5) of supplying the removing liquid toward the first principal surface W1 of the substrate W and removing the polymer film 100 from the first peripheral edge portion 110 of the first principal surface W1 is executed.

Specifically, the second nozzle driving mechanism 28 moves the removing liquid nozzle 9 to the peripheral edge position. In a state where the removing liquid nozzle 9 is placed at the peripheral edge position, the removing liquid valve 51 is opened. Thereby, the removing liquid is supplied (discharged) from the removing liquid nozzle 9 toward the first peripheral edge portion 110 of the first principal surface W1 of the substrate W (removing liquid supplying step, removing liquid discharging step).

The removing liquid discharged from the removing liquid nozzle 9 lands on the first peripheral edge portion 110 of the first principal surface W1 of the substrate W. The removing liquid on the first principal surface W1 moves toward the outer peripheral end E of the substrate W by the centrifugal force due to the rotation of the substrate W and scatters from the outer peripheral end E of the substrate W.

The polymer film 100 is dissolved into the removing liquid and discharged from the first principal surface W1 together with the removing liquid in which the polymer film 100 is dissolved. There is no need for dissolving all the polymer film 100 into the removing liquid, and part of the polymer film 100 may be peeled off from the first principal surface W1 of the substrate W by a liquid flow of the removing liquid and discharged to the outside of the substrate W. In such a way, after the first chemical liquid supplying step, the polymer film 100 serving as the protection film is removed from the first peripheral edge portion 110 of the first principal surface W1 (protection film removing step, polymer film removing step). The removing liquid nozzle 9 is an example of a protection film removing unit.

Next, the spin-drying step (Step S6) of rotating the substrate W and drying the substrate W is executed. Specifically, the removing liquid valve 51 is closed, supply of the removing liquid to the upper surface of the substrate W is stopped, and the second nozzle driving mechanism 28 retreats the removing liquid nozzle 9 to the retreat position.

Then, the rotation of the substrate W is accelerated, and the rotation speed of the substrate W reaches drying speed (second speed). The drying speed is higher than the etching rotation speed (third speed) and the rinsing speed (fourth speed), and lower than the protection film forming speed (first speed). The drying speed is, for example, not less than 1,500 rpm and not more than 2,000 rpm. Even when the drying speed is the predetermined rotation speed within a range of not less than 1,500 rpm and not more than 2,000 rpm, it is possible to select an arbitrary speed that is higher than the drying speed within a range of not less than 1,500 rpm and not more than 4,000 rpm as the protection film forming speed.

By rotating the substrate W at the third speed, the centrifugal force acts on the liquid (mainly, the removing liquid) on the substrate W. Thereby, the liquid is shaken off to a periphery of the substrate W.

After the spin-drying step (Step S6), the spin chuck 5 stops the rotation of the substrate W. After that, the second transfer robot CR enters the wet processing unit 2W, receives the processed substrate W from the spin chuck 5, and carries out the substrate W to the outside of the wet processing unit 2W (carry-out step: Step S7). The substrate W is handed over from the second transfer robot CR to the first transfer robot IR, and housed in the carrier C by the first transfer robot IR.

Summary of First Preferred Embodiment

In a case where the most superficial foundation layer 113 is exposed in the first peripheral edge portion 110 of the substrate W by performing the substrate processing unlike the first preferred embodiment, at the time of dry etching that is possibly executed after the substrate processing, there is a possibility that the most superficial foundation layer 113 is damaged in the first peripheral edge portion 110 of the first principal surface W1. Resulting from the damage, there is a concern that unevenness may occur in the most superficial foundation layer 113 and that particles, etc., may enter a concave portion of the uneven structure.

According to the first preferred embodiment, the polymer film 100 is formed so that the outer peripheral end E is exposed, and the outer peripheral end E is etched. Therefore, it is possible to make the etching width extremely small. Thus, it is possible to decrease a region to be damaged by dry etching. Eventually, it is possible to suppress generation of particles after the dry etching.

Viscosity of the protection film formation liquid is preferably not less than 0.1 Pa·sec and not more than 15 Pa·sec. If so, it is possible to furthermore reduce the width L1 of the outer peripheral end E that is not covered by the polymer film 100 but exposed.

In addition, thickness of the polymer film 100 is preferably not more than 0.3 mm. If so, it is possible to furthermore reduce the width L1 of the outer peripheral end E that is not covered by the polymer film 100 but exposed. According to the first preferred embodiment, in the protection film forming step, in a state where the protection film formation liquid is attached to the first principal surface W1, the substrate W is rotated at the protection film forming speed (first speed) that is higher than the rotation speed of the substrate W at the time of spin-drying (second speed) (high-speed rotating step). Therefore, it is possible to furthermore suppress the protection film formation liquid on the first principal surface W1 from reaching the second peripheral edge portion 111 via the outer peripheral end E.

In addition, in the etching step, the substrate W is rotated at the etching rotation speed (third speed) that is lower than the protection film forming speed (first speed) (low-speed rotating step). Therefore, it is possible to suppress the protection film formation liquid on the first principal surface W1 from reaching the second peripheral edge portion 111 via the outer peripheral end E.

According to the first preferred embodiment, the polymer film 100 is formed in the first peripheral edge portion 110 so that the inner side region 114 of the first principal surface W1 is exposed. Therefore, in comparison to a case of formation over the entire first principal surface W1, it is possible to reduce a use amount of the protection film formation liquid, and also decrease a region where the polymer film 100 is formed in the first principal surface W1. In addition, since the polymer film 100 is not formed in the inner side region 114 in the protection film forming step, it is possible to prevent in advance that the polymer film 100 remains in the inner side region 114 as a residue after the protection film removing step.

In addition, in the protection film removing step of the substrate processing according to the first preferred embodiment, the inner side region 114 is exposed. However, the removing liquid may be discharged from the removing liquid nozzle 9 toward the central portion CP of the first principal surface W1 of the substrate W and the removing liquid may be supplied to the entire first principal surface W1 of the substrate W. In that case, it is possible to wash the entire first principal surface W1 of the substrate W away with the removing liquid.

<Wet Processing Unit According to Modified Example>

Figure 7:
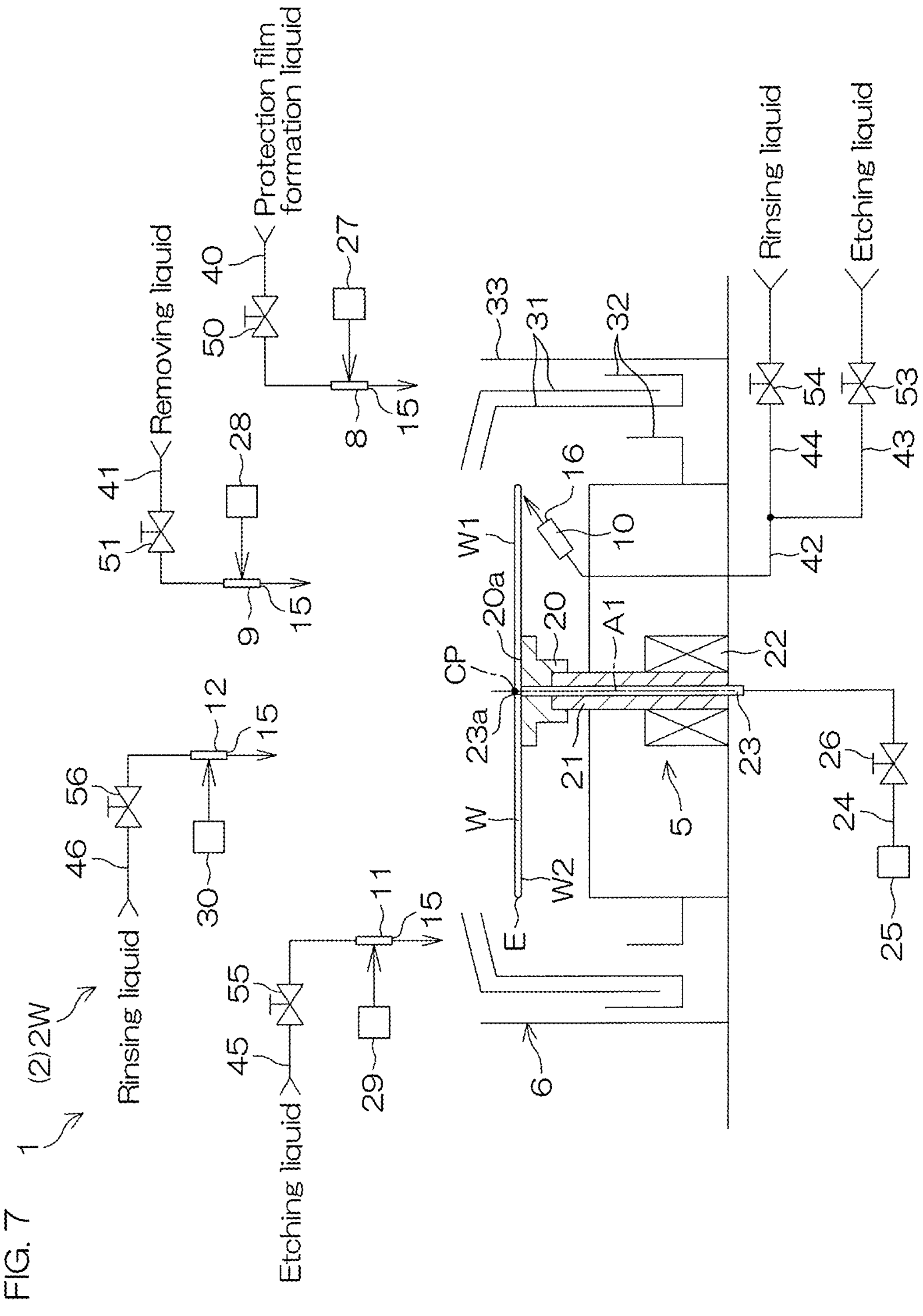
FIG. 7 is a schematic view for describing an arrangement of a wet processing unit according to a modified example.

FIG. 7 is a schematic view for describing an arrangement of a wet processing unit 2W according to a modified example. As shown in FIG. 7, a plurality of upper surface processing liquid nozzles of the wet processing unit 2W may include an etching liquid nozzle 11 and a rinsing liquid nozzle 12 in addition to the protection film formation liquid nozzle 8 and the removing liquid nozzle 9. In addition, the arrangement may be that the discharge port 15 of each of the upper surface processing liquid nozzles discharges the processing liquid perpendicularly (in the vertical direction) with respect to the upper surface of the substrate W.

A nozzle driving mechanism that moves the etching liquid nozzle 11 in the direction (horizontal direction) along the upper surface of the substrate W is called a third nozzle driving mechanism 29. A nozzle driving mechanism that moves the rinsing liquid nozzle 12 in the direction (horizontal direction) along the upper surface of the substrate W is called a fourth nozzle driving mechanism 30. Details of the nozzle driving mechanisms are the same as the above description.

As the etching liquid to be discharged from the etching liquid nozzle 11, it is possible to use the liquids listed as the etching liquid to be discharged from the lower surface processing liquid nozzle 10. As the rinsing liquid to be discharged from the rinsing liquid nozzle 12, it is possible to use the liquids listed as the rinsing liquid to be discharged from the lower surface processing liquid nozzle 10.

The etching liquid nozzle 11 is connected to an etching liquid pipe 45 through which the etching liquid is guided to the etching liquid nozzle 11. An etching liquid valve 55 that opens and closes the etching liquid pipe 45 is provided in the etching liquid pipe 45. When the etching liquid valve 55 is opened, the continuous flow of the etching liquid is discharged from the etching liquid nozzle 11.

The rinsing liquid nozzle 12 is connected to a rinsing liquid pipe 46 through which the rinsing liquid is guided to the rinsing liquid nozzle 12. A rinsing liquid valve 56 that opens and closes the rinsing liquid pipe 46 is provided in the rinsing liquid pipe 46. When the rinsing liquid valve 56 is opened, the continuous flow of the rinsing liquid is discharged from the rinsing liquid nozzle 12.

<Substrate Processing Using Wet Processing Unit According to Modified Example>

In a case where the arrangement of the wet processing unit 2W is the arrangement shown in FIG. 7, it is possible to execute the following substrate processing. FIG. 8A to FIG. 8D are schematic views for describing states of the first peripheral edge portion 110 of the first principal surface W1 of the substrate W during the substrate processing to be executed by using the wet processing unit 2W according to the modified example.

A point that the substrate processing shown in FIG. 8A to FIG. 8D is mainly different from the substrate processing shown in FIG. 5 to FIG. 6D is a point that the polymer film 100 serving as the protection film is formed over the entire first principal surface W1 of the substrate W in a protection film forming step.

Hereinafter, description will be given centering around the point that the substrate processing shown in FIG. 8A to FIG. 8D is different from the substrate processing shown in FIG. 5 to FIG. 6D. For example, since rotation speed during the substrate processing is the same as the substrate processing shown in FIG. 5 to FIG. 6D, the rotation speed will not be described.

Figure 8A:
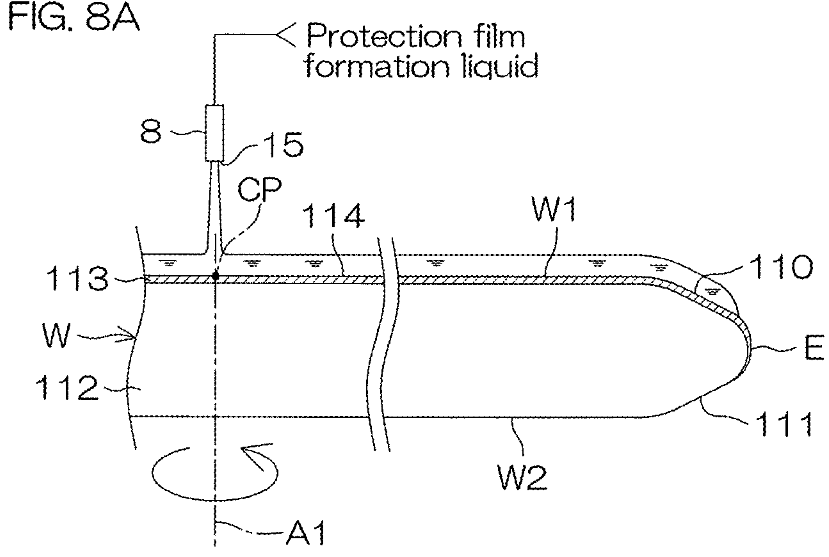
FIG. 8A is a schematic view for describing a state of the peripheral edge portion of the upper surface of the substrate during substrate processing to be executed by using the wet processing unit according to the modified example.

Specifically, after the substrate W is handed over from the second transfer robot CR to the spin chuck 5, the first nozzle driving mechanism 27 moves the protection film formation liquid nozzle 8 to the central position. In a state where the protection film formation liquid nozzle 8 is placed at the central position, the protection film formation liquid valve 50 is opened. Thereby, as shown in FIG. 8A, the protection film formation liquid is supplied (discharged) from the protection film formation liquid nozzle 8 toward the central portion CP of the first principal surface W1 of the substrate W in a rotating state (protection film formation liquid supplying step, protection film formation liquid discharging step).

The protection film formation liquid discharged from the protection film formation liquid nozzle 8 lands on the central portion CP of the first principal surface W1 of the substrate W. The protection film formation liquid on the substrate W radially spreads toward the outer peripheral end E of the substrate W by the centrifugal force due to the rotation of the substrate W. Thereby, the substantially entire first principal surface W1 of the substrate W is covered by the protection film formation liquid (covering step). In detail, the inner side region 114 and the first peripheral edge portion 110 are covered by the protection film formation liquid.

After discharge of the protection film formation liquid is stopped, by continuing the rotation of the substrate W, part of the protection film formation liquid on the substrate W scatters to the outside of the substrate W from the outer peripheral end E of the substrate W. Thereby, the liquid film of the protection film formation liquid on the substrate W is thinned (spin-off step, film thinning step). After the protection film formation liquid valve 50 is closed, the protection film formation liquid nozzle 8 is moved to the retreat position by the first nozzle driving mechanism 27.

Figure 8B:
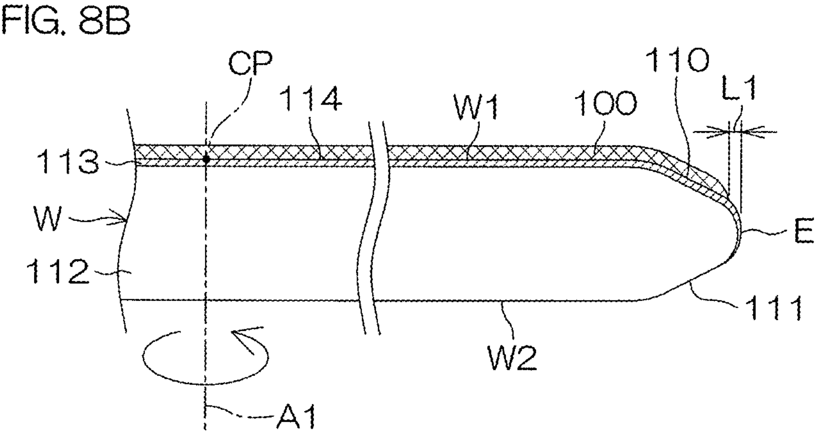
FIG. 8B is a schematic view for describing a state of the peripheral edge portion of the upper surface of the substrate during the substrate processing to be executed by using the wet processing unit according to the modified example.

By the action of the centrifugal force due to the rotation of the substrate W, the evaporation (volatilization) of the solvent from the protection film formation liquid on the substrate W is facilitated, and as shown in FIG. 8B, the polymer film 100 is formed (evaporation forming step). The polymer film 100 covers the substantially entire first principal surface W1 of the substrate W and has a circular shape. In detail, the polymer film 100 covers the inner side region 114 and the first peripheral edge portion 110.

After the polymer film 100 is formed, an etching step (Step S3) is executed. In the etching step in the substrate processing, in a state where the polymer film 100 (protection film) is formed in the first peripheral edge portion 110 of the first principal surface W1, by supplying the etching liquid to both the first principal surface W1 and the second principal surface W2, the outer peripheral end E is etched.

Specifically, the third nozzle driving mechanism 29 disposes the etching liquid nozzle 11 at the central position. In a state where the etching liquid nozzle 11 is placed at the central position, the etching liquid valve 55 is opened. Thereby, the etching liquid is discharged from the etching liquid nozzle 11 toward the central portion CP of the first principal surface W1 of the substrate W (second etching liquid supplying step, second chemical liquid discharging step). The etching liquid nozzle 11 is an example of a second chemical liquid supplying member. The etching liquid discharged from the etching liquid nozzle 11 lands on the central portion CP of the first principal surface W1.

The etching liquid on the first principal surface W1 radially spreads toward the outer peripheral end E of the substrate W by the centrifugal force due to the rotation of the substrate W. The etching liquid reaches the outer peripheral end E of the substrate W by the centrifugal force and scatters outward from there.

At the substantially same timing as opening of the etching liquid valve 55, the lower surface etching liquid valve 53 is opened. Thereby, the etching liquid is discharged from the lower surface processing liquid nozzle 10 toward the second peripheral edge portion 111 of the second principal surface W2 of the substrate W (first etching liquid supplying step, first chemical liquid discharging step). The etching liquid discharged from the lower surface processing liquid nozzle 10 lands on the second peripheral edge portion 111.

The etching liquid on the second principal surface W2 moves toward the outer peripheral end E of the substrate W by the centrifugal force due to the rotation of the substrate W. The etching liquid reaches the outer peripheral end E of the substrate W by the centrifugal force and scatters outward from there.

In such a way, in a state where the polymer film 100 is formed in the first peripheral edge portion 110, by supplying the etching liquid to the second principal surface W2 and allowing the etching liquid to reach the outer peripheral end E, the outer peripheral end E is processed with the etching liquid (first etching liquid supplying step, first chemical liquid supplying step). Then, during supply of the chemical liquid to the second principal surface W2 in the first etching liquid supplying step, the etching liquid is supplied toward the front surface of the polymer film 100 (second etching liquid supplying step, second chemical liquid supplying step).

Figure 8C:
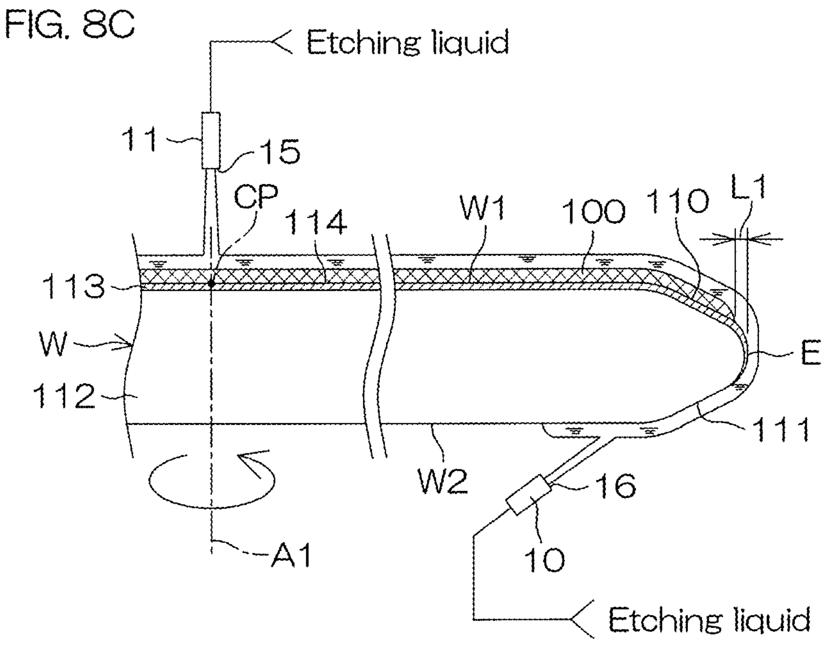
FIG. 8C is a schematic view for describing a state of the peripheral edge portion of the upper surface of the substrate during the substrate processing to be executed by using the wet processing unit according to the modified example.

As shown in FIG. 8C, by supplying the etching liquid both to the first principal surface W1 and the second principal surface W2, it is possible to supply with high reliability the etching liquid to the outer peripheral end E of the substrate W from both the first principal surface W1 and the second principal surface W2.

Next, a rinsing step (Step S4) of supplying the rinsing liquid to the second principal surface W2 and removing the etching liquid from the substrate W is executed. In the rinsing step as well, the rinsing liquid is also supplied to both the first principal surface W1 and the second principal surface W2 of the substrate W.

Specifically, by closing the etching liquid valve 55, discharge of the etching liquid from the etching liquid nozzle 11 is stopped. In a state where the discharge of the etching liquid from the etching liquid nozzle 11 is stopped, the third nozzle driving mechanism 29 moves the etching liquid nozzle 11 to the retreat position.

At the substantially same timing as closing of the etching liquid valve 55, the lower surface etching liquid valve 53 is closed. Thereby, discharge of the etching liquid from the lower surface processing liquid nozzle 10 is stopped.

Meanwhile, the fourth nozzle driving mechanism 30 moves the rinsing liquid nozzle 12 to the central position. In a state where supply of the etching liquid to the substrate W is stopped and the rinsing liquid nozzle 12 is placed at the central position, the rinsing liquid valve 56 is opened. Thereby, the rinsing liquid is discharged from the rinsing liquid nozzle 12 toward the central portion CP of the first principal surface W1 of the substrate W (second rinsing liquid discharging step). The rinsing liquid discharged from the rinsing liquid nozzle 12 lands on the central portion CP of the first principal surface W1.

The rinsing liquid on the first principal surface W1 radially spreads toward the outer peripheral end E of the substrate W by the centrifugal force due to the rotation of the substrate W. The rinsing liquid scatters from the outer peripheral end E of the substrate W by the centrifugal force.

At the substantially same timing as opening of the rinsing liquid valve 56, the lower surface rinsing liquid valve 54 is opened. Thereby, the rinsing liquid is discharged from the lower surface processing liquid nozzle 10 toward the second peripheral edge portion 111 of the second principal surface W2 (first rinsing liquid discharging step). The rinsing liquid discharged from the lower surface processing liquid nozzle 10 lands on the second peripheral edge portion 111.

The rinsing liquid on the second principal surface W2 spreads toward the outer peripheral end E of the substrate W by the centrifugal force due to the rotation of the substrate W. The rinsing liquid scatters from the outer peripheral end E of the substrate W by the centrifugal force.

Figure 8D:
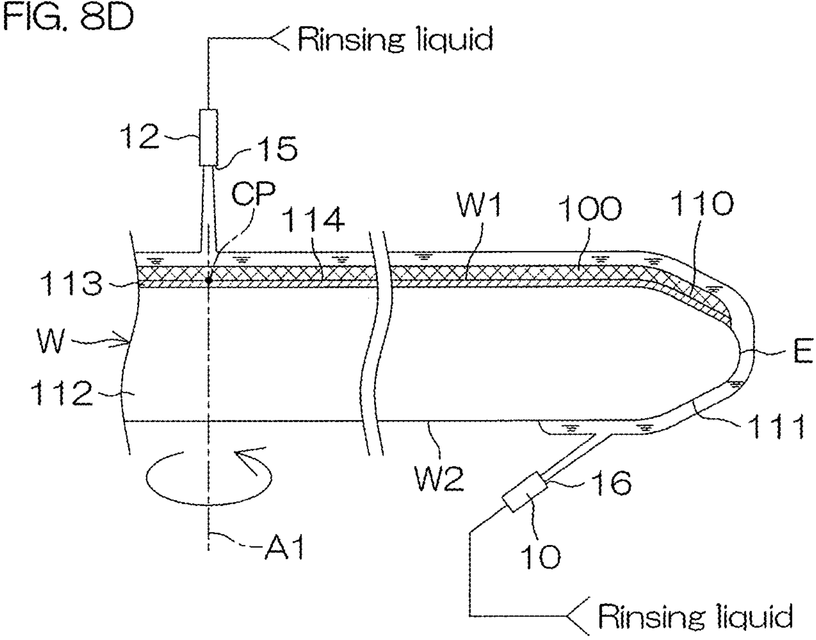
FIG. 8D is a schematic view for describing a state of the peripheral edge portion of the upper surface of the substrate during the substrate processing to be executed by using the wet processing unit according to the modified example.

As shown in FIG. 8D, by supplying the rinsing liquid to both the first principal surface W1 and the second principal surface W2, in the polymer film 100, the etching liquid attached to the outer peripheral end E and the second principal surface W2 is removed to the outside of the substrate W together with the rinsing liquid. Thereby, the etching liquid is removed from the outer peripheral end E of the substrate W.

In such a way, in a state where the polymer film 100 is formed in the first peripheral edge portion 110, the rinsing liquid is supplied to the second principal surface W2 and the etching liquid is removed from the outer peripheral end E (first rinsing liquid supplying step). Then, during supply of the rinsing liquid to the second principal surface W2 in the first rinsing liquid supplying step, the rinsing liquid is supplied toward the front surface of the polymer film 100 (second rinsing liquid supplying step).

Next, a polymer film removing step (Step S5) of supplying the removing liquid toward the first principal surface W1 of the substrate W and removing the polymer film 100 from the first peripheral edge portion 110 of the first principal surface W1 is executed.

Specifically, the second nozzle driving mechanism 28 moves the removing liquid nozzle 9 to the central position. In a state where the removing liquid nozzle 9 is placed at the central position, the removing liquid valve 51 is opened. Thereby, the removing liquid is supplied (discharged) from the removing liquid nozzle 9 toward the central portion CP of the first principal surface W1 of the substrate W (removing liquid supplying step, removing liquid discharging step).

The removing liquid discharged from the removing liquid nozzle 9 lands on the central portion CP of the first principal surface W1 of the substrate W. The removing liquid on the first principal surface W1 radially spreads toward the outer peripheral end E of the substrate W by the centrifugal force due to the rotation of the substrate W and scatters from the outer peripheral end E of the substrate W.

The polymer film 100 is dissolved into the removing liquid and discharged from the first principal surface W1 together with the removing liquid in which the polymer film 100 is dissolved. There is no need for dissolving all the polymer film 100 into the removing liquid, and part of the polymer film 100 may be peeled off from the upper surface of the substrate W by the liquid flow of the removing liquid and discharged to the outside of the substrate W.

After that, the spin-drying step (Step S6) and the carry-out step (Step S7) are executed, and the substrate processing is finished.

In the substrate processing according to the modified example, during supply of the etching liquid to the second principal surface W2, the etching liquid is supplied toward the front surface of the polymer film 100. It is possible to wash particles, etc., attached to the front surface of the polymer film 100 away with the etching liquid. Therefore, when the polymer film 100 is removed by the protection film removing step, it is possible to suppress the first principal surface W1 from being contaminated by the particles, etc., attached to the polymer film 100.

<Substrate Processing Apparatus According to Second Preferred Embodiment>

Figure 9:
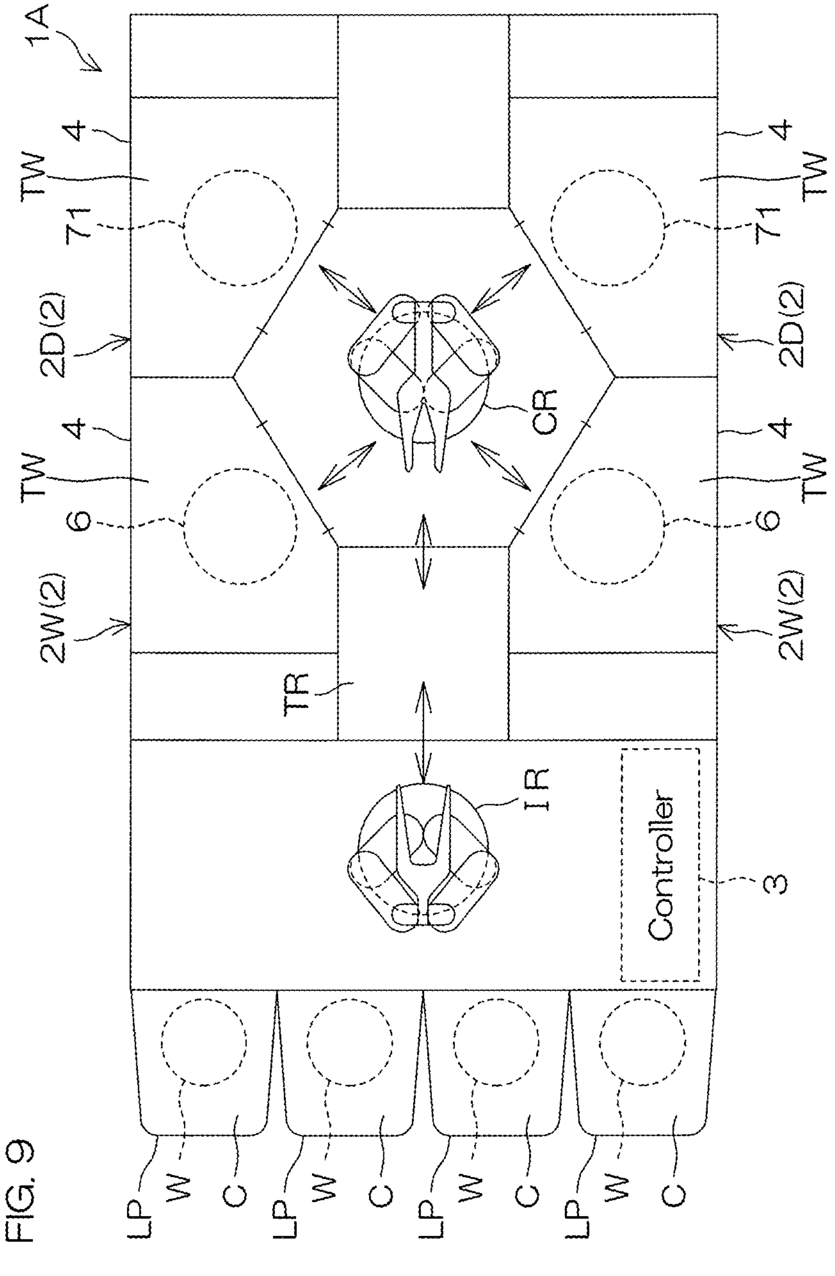
FIG. 9 is a plan view for describing an arrangement example of a substrate processing apparatus according to a second preferred embodiment of the present invention.

FIG. 9 is a plan view for describing an arrangement example of a substrate processing apparatus 1A according to the second preferred embodiment of the present invention. In FIG. 9, arrangements that are equal to the arrangements shown in FIG. 1 to FIG. 8D described above will be given the same reference signs as FIG. 1, etc., and will not be described. The same applies to FIG. 10 to FIG. 12C to be described later.

The main differences between the substrate processing apparatus 1A according to the second preferred embodiment and the substrate processing apparatus 1 according to the first preferred embodiment are that a hydrophobizing liquid is used as a protection film formation liquid, and that a plurality of processing units 2 include a plurality of dry processing units 2D. In the present preferred embodiment, a protection film formation liquid nozzle 8 also serves as a hydrophobizing liquid nozzle.

The hydrophobizing liquid used as the protection film formation liquid is a liquid that converts (for example, methylates) a most superficial foundation layer 113 of a substrate W and increases a contact angle of an upper surface of the substrate W with respect to pure water. By hydrophobizing, the contact angle of a first principal surface W1 of the substrate W is increased to, for example, 90° or more. Since the hydrophobizing liquid can suppress attachment of water, the hydrophobizing liquid is also called a water-repellent liquid.

As the hydrophobizing liquid, for example, it is possible to use a silicon hydrophobizing liquid that hydrophobizes silicon itself and a compound that contains silicon, or a metal hydrophobizing liquid that hydrophobizes metal itself and a compound that contains metal.

The metal hydrophobizing liquid contains, for example, at least one of amine bearing a hydrophobic group and an organic silicon compound.

The silicon hydrophobizing liquid is, for example, a silane coupling agent. The silane coupling agent contains, for example, at least one of hexamethyldisilazane (HMDS), tetramethylsilane (TMS), fluorinated alkylchlorosilane, alkyldisilazane, and a non-chlorine hydrophobizing agent.

The non-chlorine hydrophobizing agent contains, for example, at least one of dimethylsilyldimethylamine, dimethylsilyldiethylamine, hexamethyldisilazane, tetramethyldisilazane, bis(dimethylamino)dimethylsilane, (N, N-dimethylamino)trimethylsilane, N-(trimethylsilyl)dimethylamine, and organosilane compound.

As in the example shown in FIG. 9, two processing towers TW on the first transfer robot IR side are arranged by a plurality of wet processing units 2W, and two processing towers TW on the opposite side of the first transfer robot IR are arranged by the plurality of dry processing units 2D. Each of the dry processing units 2D is disposed in a chamber 4, and includes a light irradiation chamber 71 inside which light is irradiated to the substrate W.

<Arrangement of Dry Processing Unit>

Figure 10:
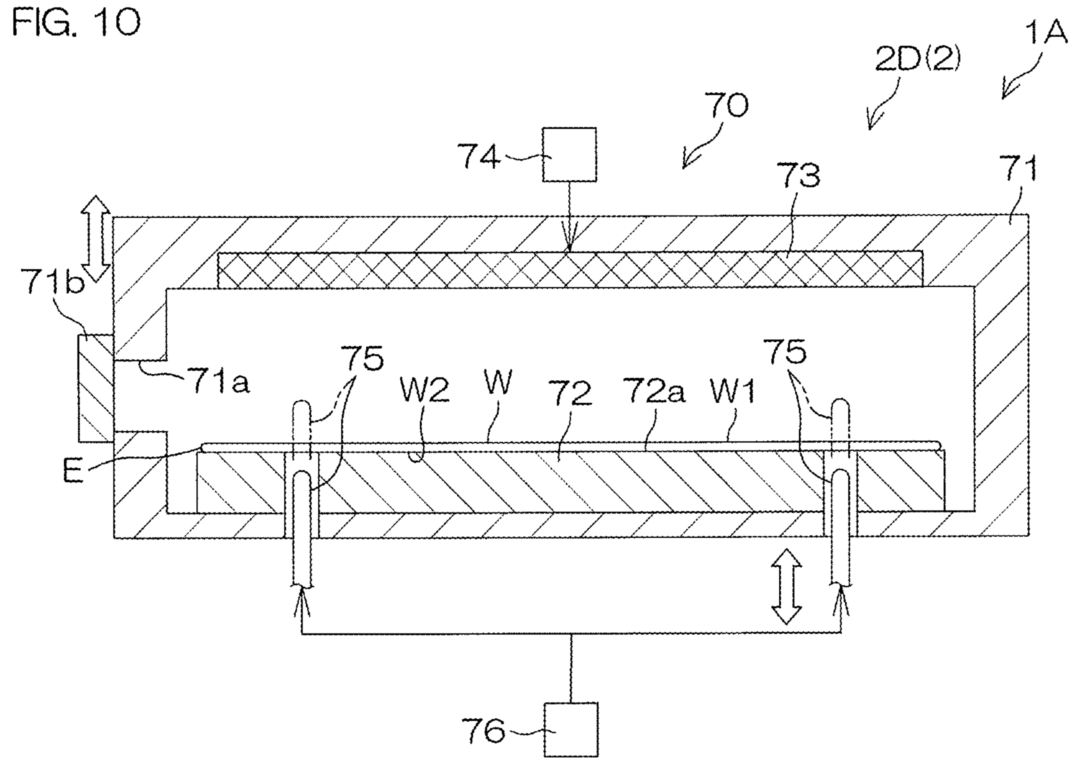
FIG. 10 is a schematic view for describing an arrangement of a dry processing unit provided in the substrate processing apparatus according to the second preferred embodiment.

FIG. 10 is a schematic view for describing an arrangement of the dry processing unit 2D according to the second preferred embodiment.

A light irradiation processing unit 70 includes a base 72 having a mount surface 72*a* on which the substrate W is mounted, a light emitting member 73 that emits light such as an ultraviolet ray toward the upper surface of the substrate W mounted on the mount surface 72*a*, a plurality of lift pins 75 passing through the base 72, the lift pins to be moved upward and downward, and a pin driving mechanism 76 that moves the plurality of lift pins 75 in the up and down direction. The light irradiation chamber 71 houses the base 72.

A carry-in/carry-out port 71*a* of the substrate W is provided on a side wall of the light irradiation chamber 71, and the light irradiation chamber 71 has a gate valve 71*b* that opens and closes the carry-in/carry-out port 71*a*. When the carry-in/carry-out port 71*a* is opened, a second transfer robot CR (not shown) can access the light irradiation chamber 71. The substrate W is horizontally held in a predetermined second processing posture by being mounted on the base 72. In the present preferred embodiment, the second processing posture is a posture of the substrate W shown in FIG. 10, and for example, a horizontal posture.

The light emitting member 73 includes, for example, light sources such as a plurality of light irradiation lamps. The light irradiation lamps are, for example, xenon lamps, mercury lamps, heavy hydrogen lamps, etc. The light emitting member 73 is arranged to irradiate an ultraviolet ray of, for example, not less than 1 nm and not more than 400 nm, and preferably, not less than 1 nm and not more than 300 nm. Specifically, an energizing unit 74 such as a power source is connected to the light emitting member 73, and by supplying electric power from the energizing unit 74, the light emitting member 73 emits light.

The plurality of lift pins 75 are respectively inserted into a plurality of through holes passing through the base 72 and the light irradiation chamber 71. The plurality of lift pins 75 are moved upward and downward between an upper position where the lift pins support the substrate W on the upper side of the mount surface 72*a* (position shown by double chain lines in FIG. 10) and a lower position where leading end portions (upper end portions) are placed on the lower side of the mount surface 72*a* (position shown by solid lines in FIG. 10) by the pin driving mechanism 76. The pin driving mechanism 76 may include an electric motor or an air cylinder, or may include an actuator other than these.

<Substrate Processing According to Second Preferred Embodiment>

Figure 11:
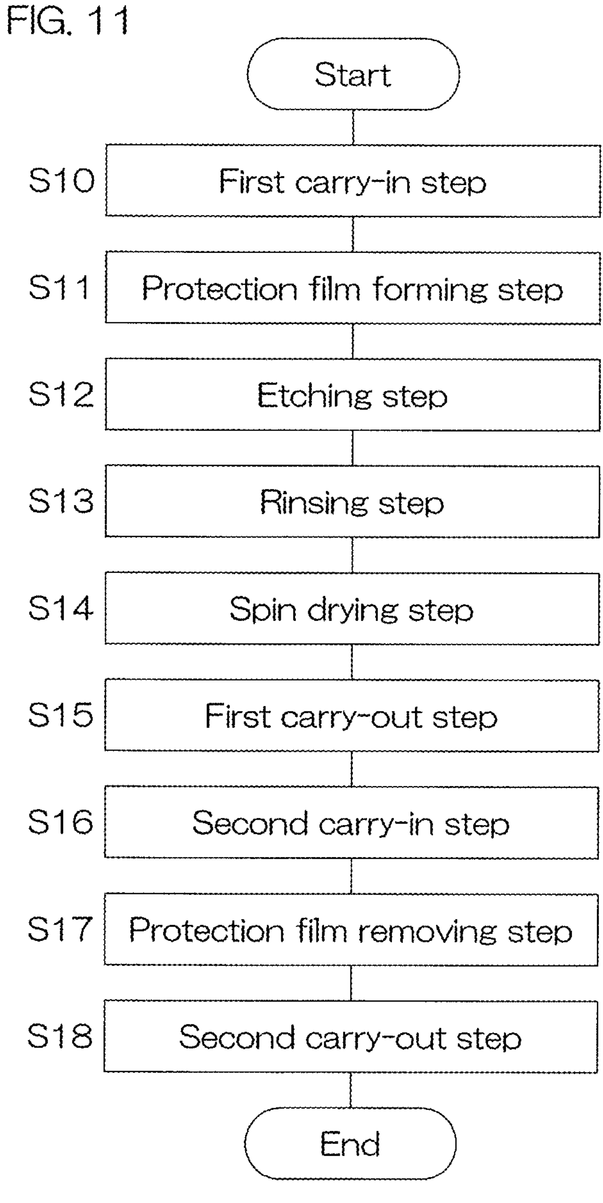
FIG. 11 is a flowchart for describing substrate processing to be executed by the substrate processing apparatus according to the second preferred embodiment.
Figure 12A:
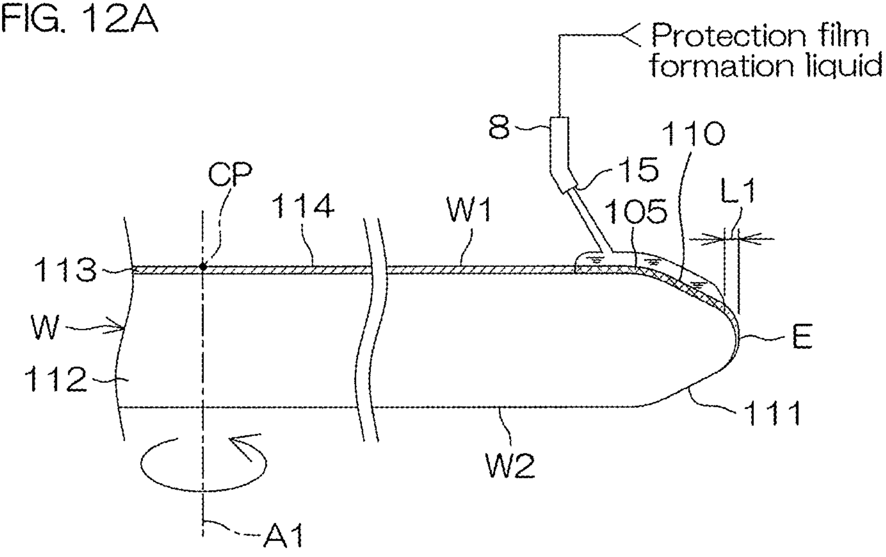
FIG. 12A is a schematic view for describing a state of a peripheral edge portion of an upper surface of a substrate during the substrate processing according to the second preferred embodiment.
Figure 12B:
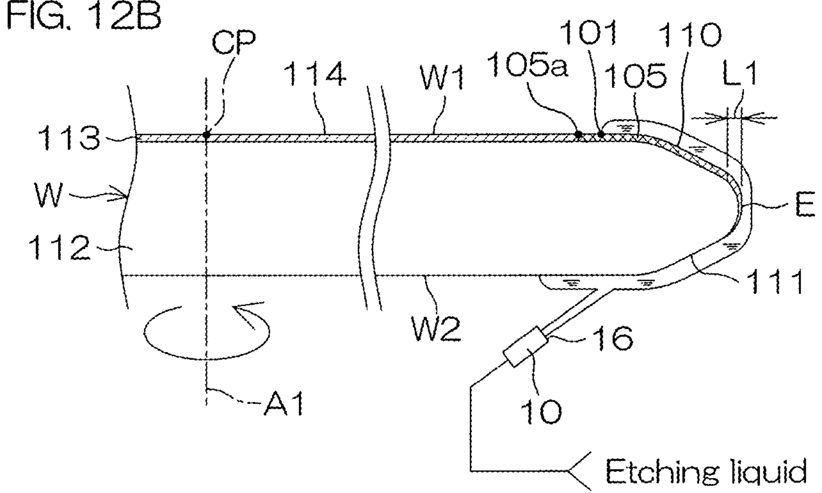
FIG. 12B is a schematic view for describing a state of the peripheral edge portion of the upper surface of the substrate during the substrate processing according to the second preferred embodiment.

FIG. 11 is a flowchart for describing substrate processing to be executed by the substrate processing apparatus 1A according to the second preferred embodiment. FIG. 12A and FIG. 12B are schematic views for describing states of a first peripheral edge portion 110 of the first principal surface W1 of the substrate W during the substrate processing according to the second preferred embodiment.

In the substrate processing according to the second preferred embodiment, for example, as shown in FIG. 11, a first carry-in step (Step S10), a protection film forming step (Step S11), an etching step (Step S12), a rinsing step (Step S13), a spin-drying step (Step S14), a first carry-out step (Step S15), a second carry-in step (Step S16), a protection film removing step (Step S17), and a second carry-out step (Step S18) are executed.

The first carry-in step (Step S10), the protection film forming step (Step S11), the etching step (Step S12), the rinsing step (Step S13), the spin-drying step (Step S14), and the first carry-out step (Step S15) are respectively the same as the first carry-in step (Step S1), the protection film forming step (Step S2), the etching step (Step S3), the rinsing step (Step S4), the spin-drying step (Step S6), and the first carry-out step (Step S7) of the substrate processing according to the first preferred embodiment (see FIG. 5).

Therefore, hereinafter, parts in these steps that are, for example, different m the substrate processing according to the first preferred embodiment will be mainly described. Since rotation speed during the substrate processing is the same as the substrate processing shown in FIG. 5 to FIG. 6D, the rotation speed will not be described.

In the protection film forming step (Step S11), as shown in FIG. 12A, by supplying a protection film formation liquid to the first peripheral edge portion 110 of the first principal surface W1 of the substrate W, in the first peripheral edge portion 110, the most superficial foundation layer 113 is converted and a hydrophobic film 105 serving as a protection film is formed. By not evaporating a solvent from a liquid film on the first principal surface W1 and forming the protection film but converting (hydrophobizing) the most superficial foundation layer 113, the hydrophobic film 105 serving as the protection film is formed (hydrophobic film forming step). The hydrophobic film 105 is also called a water-repellent film.

In the etching step (Step S12) after that, as shown in FIG. 12B, it is possible to etch the most foundation layer 113 exposed from a front superficial surface of an outer peripheral end E without removing the hydrophobic film 105.

An etching liquid does not reach an inner peripheral end 105*a* of the hydrophobic film 105 in the first peripheral edge portion 110 of the first principal surface W1 but stays on the outer side of the inner peripheral end 105*a*. The inner peripheral end 105*a* of the hydrophobic film 105 is placed on the inner side of a position where the etching liquid reaches (inner peripheral end 101 of the etching liquid) in the first peripheral edge portion 110 of the first principal surface W1.

Figure 12C:
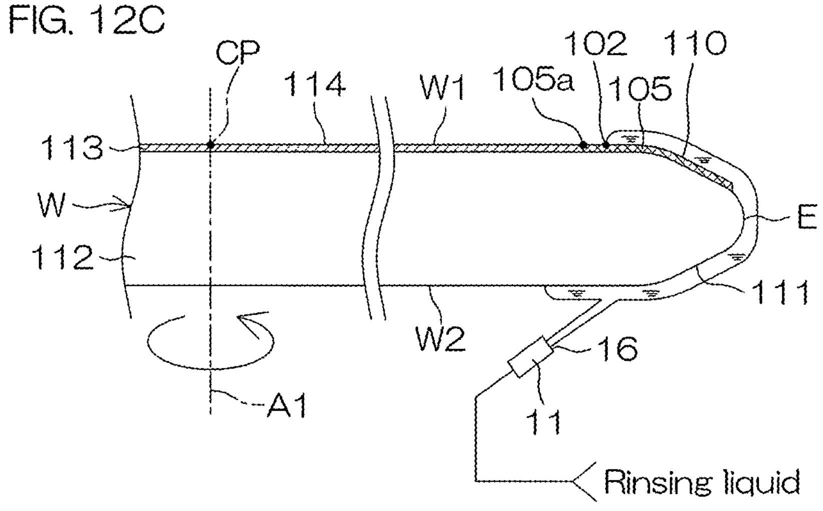
FIG. 12C is a schematic view for describing a state of the peripheral edge portion of the upper surface of the substrate during the substrate processing according to the second preferred embodiment.

In the rinsing step (Step S13) after the etching step (Step S12), as shown in FIG. 12C, the etching liquid attached to the hydrophobic film 105, the outer peripheral end E, and the second principal surface W2 is removed to the outside of the substrate W together with a rinsing liquid. Thereby, the etching liquid is removed from the outer peripheral end E of the substrate W.

The rinsing liquid does not reach the inner peripheral end 105*a* of the hydrophobic film 105 in the first peripheral edge portion 110 of the first principal surface W1 but stays on the outer side of the inner peripheral end 105*a*. The inner peripheral end 105*a* of the hydrophobic film 105 is placed on the inner side of a position where the rinsing liquid reaches (inner peripheral end 102 of the rinsing liquid).

After the substrate W is dried in the spin-drying step (Step S14), the substrate W is carried out from the wet processing unit 2 by the second transfer robot CR (first carry-out step: Step S15).

After the first carry-out step (Step S15), the substrate W is carried into the dry processing unit 2D by the second transfer robot CR, and handed over to the plurality of lift pins 75 (second carry-in step: Step S16). After that, by moving the plurality of lift pins 75 to the lower position by the pin driving mechanism 76, the substrate W is mounted on the mount surface 72*a* of the base 72. At the time, the substrate W is mounted on the mount surface 72*a* so that the first principal surface W1 is the upper surface.

In a state where the substrate W is mounted on the mount surface 72*a*, by supplying electric power to the light emitting member 73 from the energizing unit 74, light L is emitted from the light emitting member 73 (light emitting step). The light L emitted from the light emitting member 73 is irradiated to the first principal surface W1 (light irradiating step). By irradiation of light, the hydrophobic film 105 serving as the protection film is removed (hydrophobic film removing step, protection film removing step: Step S17). In detail, by irradiating light, the hydrophobic film 105 is converted (hydrophilized) and reverted to the most superficial foundation layer 113. In such a way, after the first chemical liquid supplying step, the hydrophobic film 105 is removed. The light emitting member 73 is an example of the protection film removing unit.

After the hydrophobic film 105 is removed, by moving the plurality of lift pins 75 to the upper position by the pin driving mechanism 76, the plurality of lift pins 75 bring up the substrate W from the mount surface 72*a* of the base 72. The second transfer robot CR receives the substrate W from the plurality of lift pins 75 and carries the substrate W out from the dry processing unit 2D (second carry-out step: Step S18). The substrate W is handed over to the first transfer robot IR from the second transfer robot CR, and housed in the carrier C by the first transfer robot IR.

According to the second preferred embodiment, the same effects as the first preferred embodiment are exerted.

Other Preferred Embodiments

The present invention is not restricted to the preferred embodiments described above and can be implemented in further other modes.

(1) A plurality of lower surface processing liquid nozzles 10 may be provided along the circumferential direction of the spin base 20. By discharging the processing liquid from the plurality of lower surface processing liquid nozzles 10 toward the lower surface of the substrate W, it is possible to evenly supply the processing liquid to the lower surface of the substrate W over the entire region in the circumferential direction.

(2) In the preferred embodiments described above, the hydrophobic film 105 is hydrophilized by the irradiation of light. The hydrophobic film 105 may be hydrophilized by processing other than the irradiation of light. For example, the hydrophobic film 105 may be hydrophilized by supplying a liquid to the hydrophobic film 105. In addition, the hydrophobic film 105 may be hydrophilized by supplying a hydrophilizing gas such as an ozone gas to the hydrophobic film 105. The hydrophobic film 105 may also be hydrophilized by irradiating light to the first principal surface W1 while supplying the hydrophilizing gas to the hydrophobic film 105.

(3) In the preferred embodiments described above, the polymer film 100 is removed by the supply of the removing liquid. However, the polymer film 100 may be removed by processing other than the supply of the removing liquid. For example, the polymer film 100 may be removed by irradiation of light, or may be removed by a gaseous removing agent.

In addition, the polymer film 100 may be removed from the first peripheral edge portion 110 of the first principal surface W1 by decomposing or rearranging polymer.

(4) The wet processing unit 2W according to the modified example of FIG. 7 can also be applied to the substrate processing apparatus 1A according to the second preferred embodiment. By doing so, it is possible to execute substrate processing of forming the hydrophobic film 105 over the entire upper surface of the substrate W and supplying the etching liquid to both the upper surface and the lower surface of the substrate W.

In addition, the protection film forming speed (first speed) is not always required to be higher than the rotation speed of the substrate W at the time of spin-drying (second speed), and the etching rotation speed (third speed) is not required to be higher than the protection film forming speed (first speed). However, as in the preferred embodiments described above, when the first speed is higher than the second speed and the third speed, in comparison to a case where the first speed is not higher than the second speed and the third speed, it is easier to suppress the protection film formation liquid on the first principal surface W1 from reaching the second peripheral edge portion 111.

(5) The first processing posture and the second processing posture are not always required to be the horizontal posture. That is, the first processing posture and the second processing posture may be held in a vertical posture or may be a posture in which the principal surfaces of the substrate W are inclined with respect to a horizontal plane.

In addition, the substrate W may be held so that the first principal surface W1 of the substrate W is the lower surface. That is, unlike the substrate processing according to the preferred embodiments described above, the processing may be performed to the lower surface of the substrate W. Specifically, the substrate processing apparatus may be arranged so as to execute substrate processing of forming the protection film in the peripheral edge portion of the lower surface of the substrate W and processing the peripheral edge portion of the upper surface of the substrate W and the outer peripheral end E of the substrate W with the etching liquid.

(6) In the preferred embodiments described above, the substrate processing by etching is executed. In the substrate processing, processing other than etching may be performed, and processing with a chemical liquid other than the etching liquid may be executed.

(7) In the preferred embodiments described above, the arrangement is that the plurality of processing liquids are respectively discharged from the plurality of upper surface processing liquid nozzles. However, the mode of discharging the processing liquids is not restricted to the preferred embodiments described above. For example, unlike the preferred embodiments described above, the processing liquids may be discharged from fixed nozzles whose positions are fixed in the chamber 4, or the arrangement may be that all the processing liquids are discharged from a single nozzle toward the upper surface of the substrate W.

In addition, the arrangement may be that the plurality of upper surface processing liquid nozzles are integrally moved by a single nozzle driving mechanism.

Further, in the preferred embodiments described above, the nozzles are exemplified as the members that discharge the processing liquids. However, the member that discharges each of the processing liquids is not restricted to a nozzle. That is, the member that discharges the processing liquid is only required to be a member that functions as a processing liquid discharging member that discharges a processing liquid.

(8) In the preferred embodiments described above, the polymer film 100 or the hydrophobic film 105 is formed by supplying the continuous flow of the protection film formation liquid to the upper surface of the substrate W and spreading the protection film formation liquid by the centrifugal force. However, the method of supplying the protection film formation liquid is not restricted thereto.

For example, while supplying the protection film formation liquid to the upper surface of the substrate W, the protection film formation liquid nozzle 8 may be moved in the direction along the upper surface of the substrate W. In addition, unlike the preferred embodiments described above, at the time of forming the polymer film 100, by heating the protection film formation liquid on the substrate W, the evaporation of the solvent may be facilitated and formation of the polymer film 100 may be facilitated.

In addition, unlike the preferred embodiments described above, by applying the protection film formation liquid to the upper surface of the substrate W, the polymer film 100 or the hydrophobic film 105 may be formed on the upper surface of the substrate W. In detail, the protection film formation liquid may be applied to the upper surface of the substrate W by moving a bar-shaped application member in which the protection film formation liquid is attached to a front surface thereof along the upper surface of the substrate W while bringing the application member into contact with the upper surface of the substrate W.

(9) Unlike the first preferred embodiment described above, the light emitting member 73 may be provided in the wet processing unit 2W. In that case, a light source of the light emitting member 73 is preferably disposed out of the chamber 4. For example, the light source may be disposed out of the chamber 4 and a leading end of an optical fiber (not shown) through which the light L emitted from the light source passes may be disposed in the chamber 4. If so, it is possible to execute the hydrophobic film removing step without providing the dry processing unit 2D.

(10) In the preferred embodiments described above, the spin chuck 5 is a suction type spin chuck that suctions the substrate W onto the spin base 20. The spin chuck 5 is not restricted to the suction type spin chuck. For example, the spin chuck 5 may be a gripping type spin chuck in which the outer peripheral end E of the substrate W is gripped by a plurality of gripping pins (not shown). In a case where the gripping type spin chuck is adopted, at the time of supplying the processing liquid to the substrate W, preferably, a first group of a plurality of gripping pins and a second group of a plurality of gripping pins are switched to hold the substrate W.

In a case where the gripping type spin chuck 5 is adopted, it is possible to provide a lower surface processing liquid nozzle that opposes a central portion of the lower surface of the substrate W. Therefore, it is possible to discharge the processing liquid toward the central portion of the lower surface of the substrate W.

(11) In the preferred embodiments described above, some of the pipes, the pumps, the valves, the actuators, etc., are not shown in the figures. However, it does not mean that these members do not exist. In fact, these members are provided at proper positions.

(12) In the preferred embodiments described above, the controller 3 controls the entire substrate processing apparatus 1. However, controllers that control the members of the substrate processing apparatus 1 may be dispersed at a plurality of points. In addition, the controller 3 is not required to directly control the members, and signals output from the controller 3 may be received by slave controllers that control the members of the substrate processing apparatus 1.

(13) In addition, in the preferred embodiments described above, the substrate processing apparatus 1, 1A includes the transfer robots (of the first transfer robot IR and the second transfer robot CR), the plurality of processing units 2, and the controller 3. However, the substrate processing apparatus 1, 1A may be arranged by a single processing unit 2 and the controller 3 without including the transfer robots. Alternatively, the substrate processing apparatus 1, 1A may be arranged only by a signal processing unit 2. In other words, the processing unit 2 may be an example of the substrate processing apparatus.

(14) It is noted that in the preferred embodiments described above, the expressions like "along," "horizontal," "vertical," and "cylindrical" are used. However, the expressions are not required to strictly mean "along," "horizontal," "vertical," and "cylindrical." That is, these expressions allow for deviations in manufacturing precision, installation precision, etc.

(15) In addition, the arrangements are sometimes schematically shown by blocks in the figures. However, a shape, a size, and a positional relationship of the blocks do not indicate a shape, a size, and a positional relationship of the arrangements.

While the preferred embodiments of the present invention have been described in detail, these are merely specific examples used to clarify the technical content of the present invention and the present invention should not be interpreted as being limited to these specific examples, and the scope of the present invention shall be limited only by the appended claims.

REFERENCE SIGNS LIST

1: Substrate processing apparatus
1A: Substrate processing apparatus
8: Protection film formation liquid nozzle (protection film forming member)
9: Removing liquid nozzle (protection film removing unit)
10: Lower surface processing liquid nozzle (chemical liquid supplying member)
11: Etching liquid nozzle (chemical liquid supplying member)
62: Light emitting member (protection film removing unit)
100: Polymer film (protection film)
**100*a***: Inner peripheral end
105: Hydrophobic film (protection film)
**105*a***: Inner peripheral end
110: First peripheral edge portion
111: Second peripheral edge portion
A1: Rotational axis
CP: Central portion
W: Substrate
W1: First principal surface
W2: Second principal surface

The invention claimed is:

1. A substrate processing method that processes a substrate having a first principal surface that has a first peripheral edge portion, a second principal surface that is a surface on the opposite side of the first principal surface, the second principal surface having a second peripheral edge portion, and an outer peripheral end that couples the first peripheral edge portion and the second peripheral edge portion, the substrate processing method comprising:

a protection film forming step of supplying a protection film formation liquid to the first principal surface, and forming a protection film in the first peripheral edge portion;

a first chemical liquid supplying step of supplying a chemical liquid to the second principal surface, allowing the chemical liquid to reach the outer peripheral end, and processing the outer peripheral end with the chemical liquid in a state where the protection film is formed in the first peripheral edge portion; and a protection film removing step of removing the protection film after the first chemical liquid supplying step.

2. The substrate processing method according to claim 1, wherein the protection film forming step includes a high-speed rotating step of rotating the substrate about a rotational axis passing through a central portion of the first principal surface at first speed in a state where the protection film formation liquid is attached to the first principal surface, and the substrate processing method further comprises a spin-drying step of rotating the substrate at second speed that is lower than the first speed and drying the substrate after the first chemical liquid supplying step.

3. The substrate processing method according to claim 2, wherein the first chemical liquid supplying step includes a low-speed rotating step of rotating the substrate at third speed that is lower than the first speed and the second speed while supplying the chemical liquid to the second principal surface.

4. The substrate processing method according to claim 1, wherein the protection film removing step includes a removing liquid supplying step of supplying a removing liquid that removes the protection film to the first principal surface.

5. The substrate processing method according to claim 1, wherein the protection film removing step includes a light irradiating step of irradiating light to the first principal surface.

6. The substrate processing method according to claim 1, wherein the protection film forming step includes a step of forming the protection film in the first peripheral edge portion so that an inner side region adjacent to the first peripheral edge portion is exposed in the first principal surface.

7. The substrate processing method according to claim 6, wherein the first chemical liquid supplying step includes a step of allowing the chemical liquid to reach the first peripheral edge portion from the second principal surface via the outer peripheral end, and an inner peripheral end of the protection film formed in the protection film forming step is placed on the inner side of a position where the chemical liquid reaches in the first peripheral edge portion of the first principal surface.

8. The substrate processing method according to claim 1, wherein the protection film forming step includes a step of forming the protection film over the entire first principal surface.

9. The substrate processing method according to claim 8, further comprising:

a second chemical liquid supplying step of supplying a chemical liquid toward a front surface of the protection film during supply of the chemical liquid to the second principal surface in the first chemical liquid supplying step.

10. The substrate processing method according to claim 1, wherein the protection film forming step includes a polymer film forming step of forming a polymer film containing polymer as the protection film by supplying a polymer-containing liquid containing polymer to the first principal surface as the protection film formation liquid.

11. The substrate processing method according to claim 1, wherein the protection film forming step includes a hydrophobic film forming step of forming a hydrophobic film as the protection film by supplying a hydrophobizing liquid to the first principal surface as the protection film formation liquid.

12. A substrate processing apparatus that processes a substrate having a first principal surface that has a first peripheral edge portion, a second principal surface that is a surface on the opposite side of the first principal surface, the second principal surface having a second peripheral edge portion, and an outer peripheral end that couples the first peripheral edge portion and the second peripheral edge portion, the substrate processing apparatus comprising:

a protection film forming member that includes a nozzle to supply a protection film formation liquid to the first principal surface, and forms a protection film in the first peripheral edge portion;

a chemical liquid supplying member that includes a nozzle to supply a chemical liquid to the second principal surface, and processes the second principal surface and the outer peripheral end with the chemical liquid in a state where the protection film is formed in the first peripheral edge portion; and a protection film remover that removes the protection film.

* * * * *